(12) United States Patent
Maehara et al.

(10) Patent No.: US 8,232,616 B2
(45) Date of Patent: Jul. 31, 2012

(54) SOLID-STATE IMAGING DEVICE AND PROCESS OF MAKING SOLID STATE IMAGING DEVICE

(75) Inventors: Yoshiki Maehara, Kanagawa (JP); Takashi Goto, Kanagawa (JP); Hideyuki Suzuki, Kanagawa (JP); Daigo Sawaki, Kanagawa (JP)

(73) Assignee: Fujifilm Corporation (JP)

( * ) Notice: Subject to any disclaimer, the term of this patent is extended or adjusted under 35 U.S.C. 154(b) by 158 days.

(21) Appl. No.: 12/870,366

(22) Filed: Aug. 27, 2010

(65) Prior Publication Data

US 2011/0049661 A1 Mar. 3, 2011

(30) Foreign Application Priority Data

Aug. 28, 2009 (JP) ............................... P2009-199046
Jun. 30, 2010 (JP) ............................... P2010-150593

(51) Int. Cl.
*H01L 27/146* (2006.01)
*H01L 51/00* (2006.01)
(52) U.S. Cl. ............... 257/444; 257/443; 257/E51.012; 257/E51.014; 257/E27.13; 257/E27.132
(58) Field of Classification Search .............. 257/443, 257/444, 40, E51.012, E51.014, E27.13, 257/E27.132
See application file for complete search history.

(56) References Cited

U.S. PATENT DOCUMENTS

| | | | |
|---|---|---|---|
| 6,300,612 B1 | 10/2001 | Yu | |
| 2007/0063156 A1 | 3/2007 | Hayashi | |
| 2007/0205477 A1 | 9/2007 | Yokoyama | |
| 2008/0035965 A1 | 2/2008 | Hayashi | |
| 2008/0230123 A1* | 9/2008 | Mitsui et al. ................. | 136/263 |
| 2008/0246107 A1* | 10/2008 | Maehara ....................... | 257/432 |
| 2009/0050881 A1* | 2/2009 | Hayashi ......................... | 257/40 |
| 2009/0057659 A1* | 3/2009 | Maehara et al. ............... | 257/40 |
| 2010/0051912 A1* | 3/2010 | Gregory ......................... | 257/40 |
| 2011/0049591 A1* | 3/2011 | Nakatani et al. ............. | 257/292 |

FOREIGN PATENT DOCUMENTS

| | | |
|---|---|---|
| JP | 59-119980 A | 7/1984 |
| JP | 63-173002 A | 7/1988 |
| JP | H2-143560 A | 6/1990 |

(Continued)

OTHER PUBLICATIONS

Japanese Office Action "Notification of Reasons for Refusal" with mailing date of Jan. 20, 2010; Japanese Patent Application No. 2009-199046 with English Translation.

*Primary Examiner* — Victor A Mandala
(74) *Attorney, Agent, or Firm* — Studebaker & Brackett PC; Donald R. Studebaker

(57) ABSTRACT

A solid state imaging device includes an array of pixels, each of the pixels includes: a pixel electrode; an organic layer; a counter electrode; a sealing layer; a color filter; and a readout circuit as defined herein, the photoelectric layer contains an organic p type semiconductor and an organic n type semiconductor, an ionization potential of the charge blocking layer and an electron affinity of the organic n type semiconductor in the photoelectric layer have a difference of at least 1 eV, and the solid-state imaging device further includes a transparent partition wall between adjacent color filters of adjacent pixels of the array of pixels, the partition wall being made from a transparent material having a lower refractive index than a material forming the color filters.

14 Claims, 23 Drawing Sheets

FOREIGN PATENT DOCUMENTS

| | | |
|---|---|---|
| JP | H8-250698 A | 9/1996 |
| JP | 2003-332544 A | 11/2003 |
| JP | 2007-67212 A | 3/2007 |
| JP | 2007-088033 A | 4/2007 |
| JP | 2007-273945 A | 10/2007 |
| JP | 2008-072090 A | 3/2008 |

* cited by examiner

PIXEL ELEC-
TRODE 104

PHOTOELEC-
TRIC LAYER 12

CHARGE BLOCK-
ING LAYER 15

COUNTER
ELECTRODE 108

2. PHOTORESIST FORMATION

3. PATTERNWISE EXPOSURE - DEVELOPMENT - POST BAKING

4. DRY ETCHING

FIG. 26A  8. PATTERNWISE EXPOSURE - DEVELOPMENT - POST BAKING
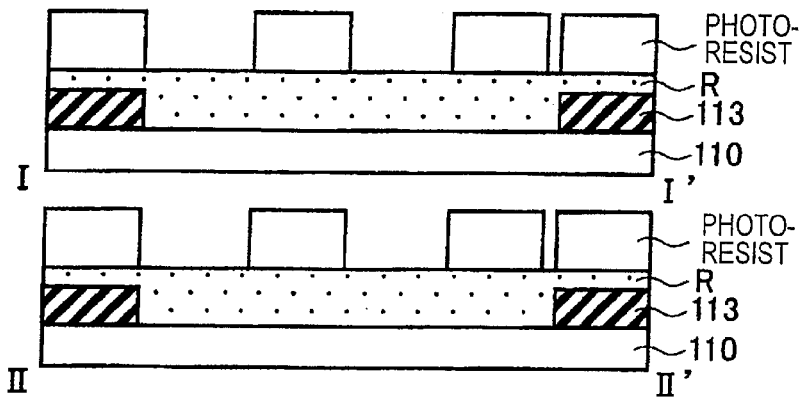
FIG. 26B
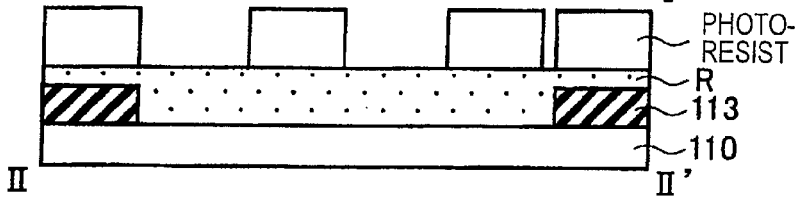
FIG. 27A  9. DRY ETCHING
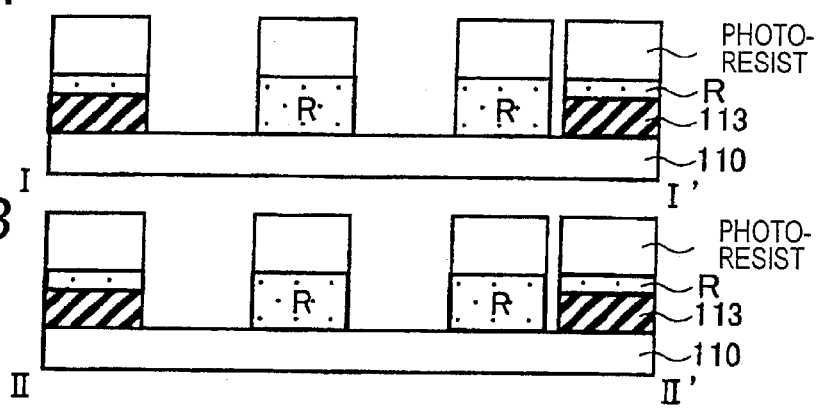
FIG. 27B
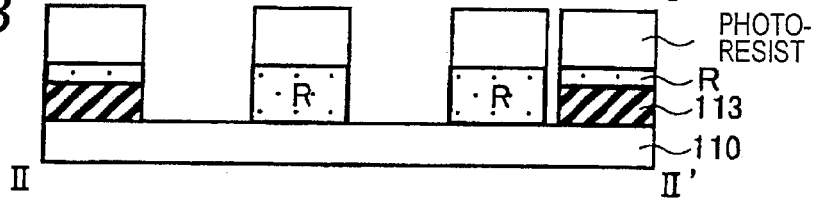
FIG. 28A  10. REMOVAL OF PHOTORESIST
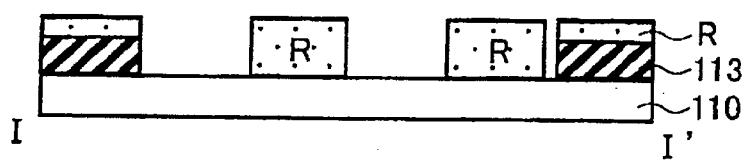
FIG. 28B
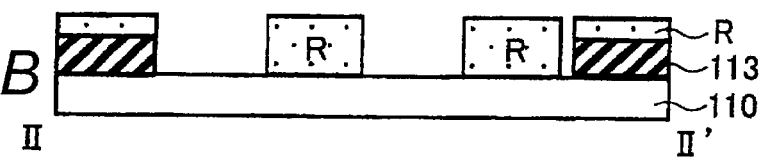

15. DRY ETCHING

16. REMOVAL OF PHOTORESIST

FIG. 35A  17. FORMATION OF PARTITION WALL MATERIAL LAYER
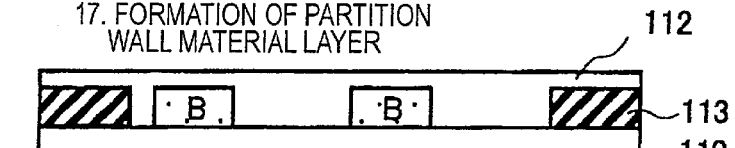
FIG. 35B
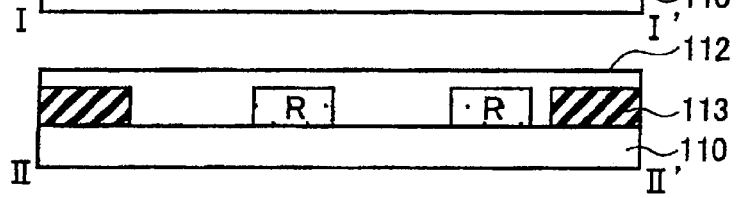
FIG. 36A  18. PLANARIZATION
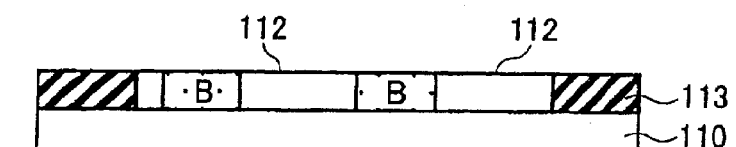
FIG. 36B
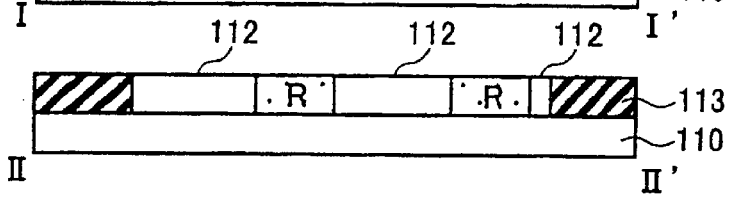
FIG. 37A  19. FORMATION OF PHOTORESIST
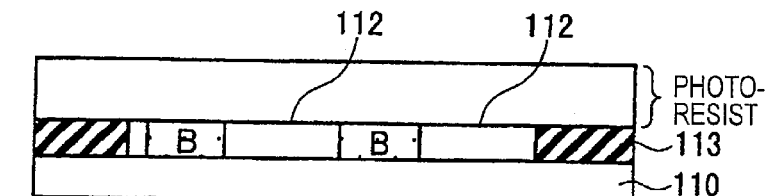
FIG. 37B
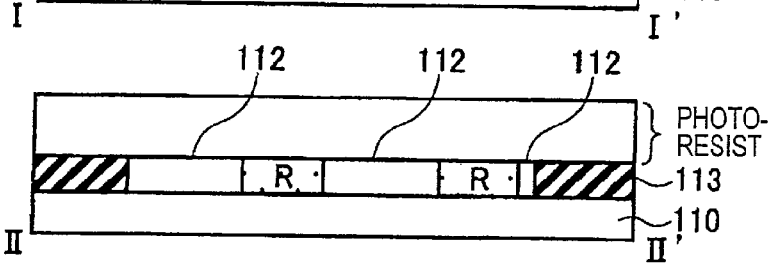

FIG. 38
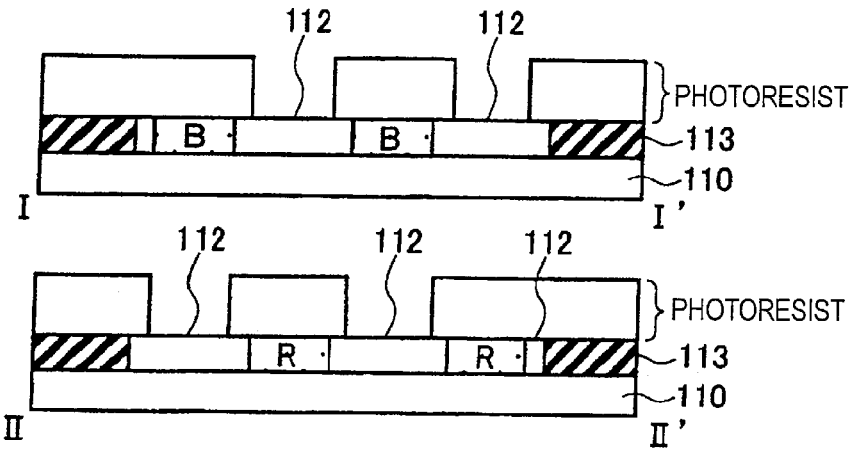
FIG. 39
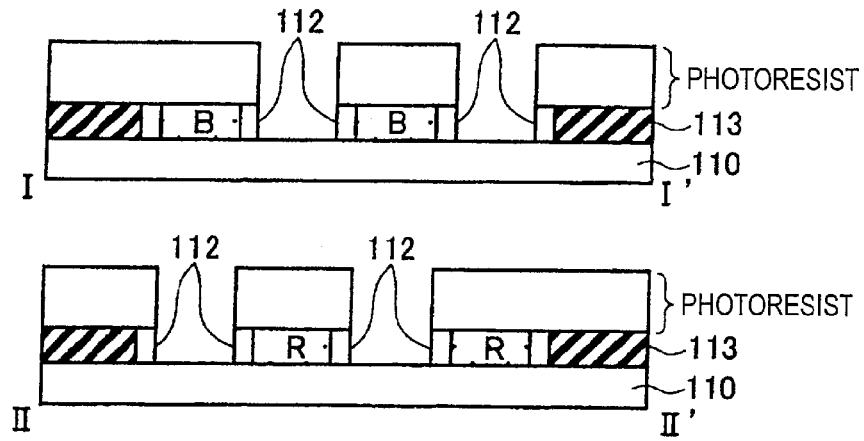
FIG. 40A
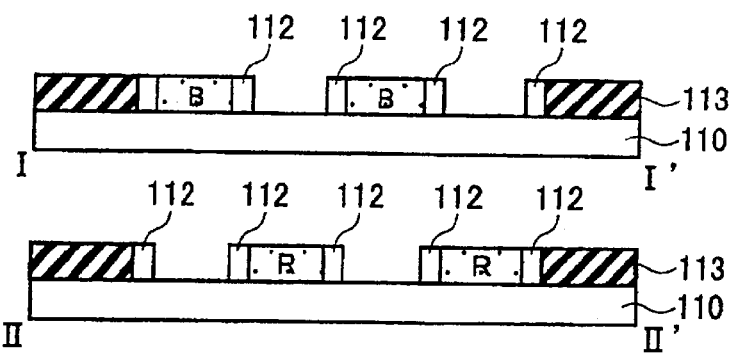
FIG. 40B

SOLID-STATE IMAGING DEVICE AND PROCESS OF MAKING SOLID STATE IMAGING DEVICE

FIELD OF THE INVENTION

This invention relates to a solid-state imaging device, and a method of making a solid state imaging device.

BACKGROUND OF THE INVENTION

As image sensors mounted on digital still cameras, digital video cameras, mobile phone cameras, and endoscope cameras, solid state imaging apparatus called CCD sensors or CMOS sensors which include a substrate, e.g., a silicon chip, and an array of pixels containing a photodiode and read out signal charge corresponding to photoelectrons generated in the photodiode of each pixel by a CCD or CMOS readout circuit are known.

The known solid state imaging apparatus includes not only the photodiode but a signal readout circuit and an accompanying multilevel interconnect formed on the semiconductor substrate for every pixel. Therefore, as the pixel pitch reduces, the area ratio of the circuit region in unit pixel becomes larger, which of necessity raises the problem of reduction in the effective area of the photodiode, i.e., reduction of a pixel aperture ratio. Reduction of aperture ratio leads to reduction of sensitivity.

To overcome the problem, a stacked or tandem solid state imaging apparatus has been proposed as in JP 1-34509B, in which a photoelectric layer is superposed on a semiconductor substrate having formed therein circuitry and wiring to increase the pixel aperture ratio. A representative structure of such a configuration includes a semiconductor substrate and a large number of photoelectric devices arrayed two-dimensionally in parallel to the substrate, the photoelectric devices each including a pixel electrode formed on the substrate, a photoelectric layer stacked on the pixel electrode, and a counter electrode stacked on the photoelectric layer. With a bias voltage applied between the pixel electrode and the counter electrode, excitons photogenerated in the photoelectric layer are dissociated into electrons and holes. The electrons or holes are swept toward the pixel electrode by the bias voltage, and the signals corresponding to the electrons or holes collected at the pixel electrode are read out by a CCD or CMOS readout circuit formed in the semiconductor substrate.

Photoelectric devices having a photoelectric layer made of an organic semiconductor are known from, e.g., U.S. Pat. No. 6,300,612, JP 2007-88033A and JP 2008-72090A. Because a photoelectric layer of an organic semiconductor has a large absorption coefficient, it is effective with a reduced film thickness, involves little charge diffusion to adjacent pixels, and thereby provides a photoelectric device with minimized optical and electrical cross-talk.

JP 2007-88033A discloses a photoelectric device having a photoelectric layer of an organic semiconductor between opposing electrodes. Provided between one of the electrodes and the photoelectric layer is a charge blocking layer for blocking charge injection from that electrode to the photoelectric layer. The ionizing potential and electron affinity of the charge blocking layer are specified in relation to the ionization potential of the adjacent electrode and the electron affinity of the organic photoelectric layer.

JP 2008-72090A discloses a photoelectric device having a photoelectric layer of an organic semiconductor between opposing electrodes. Provided between at least one of the electrodes and the photoelectric layer is a multi-layered charge blocking layer.

SUMMARY OF THE INVENTION

The photoelectric device of U.S. Pat. No. 6,300,612, which uses a photoelectric layer containing a p-type organic semiconductor and an n-type organic semiconductor, generates a considerably large dark current and needs improvement on SN ratio. The study by the inventors of the present invention has revealed that dark current is not prevented only by the techniques of JP 2007-88033A and JP 2008-72090A.

The present inventors assumed that the relationship between electron affinity Ea of the organic semiconductor contained in the photoelectric layer and ionization potential Ip of the charge blocking layer is related to dark current generation.

The invention provides a solid state imaging device and a method of making the solid state imaging device, in which Ea of an organic semiconductor in a photoelectric layer and Ip of a charge blocking layer are appropriately selected, whereby a dark current is reduced to bring about an improved SN ratio, and color cross-talk is controlled.

The invention provides a solid-state imaging device including an array of pixels. Each pixel includes a pixel electrode, an organic layer provided above the pixel electrode and having a photoelectric layer generating charges in response to light received, a counter electrode provided above the organic layer and common to the plurality of pixels, a sealing layer covering the counter electrode, a color filter provided above the sealing layer, and a readout circuit reading signals corresponding to the charges collected by the pixel electrode. The photoelectric layer contains an organic p type semiconductor and an organic n type semiconductor. The organic layer further has a charge blocking layer being provided between the photoelectric layer and at least one of the pixel electrode and the counter electrode and blocking charge injection from the pixel electrode and/or the counter electrode to the photoelectric layer. The ionization potential of the charge blocking layer and the electron affinity of the organic n type semiconductor present in the photoelectric layer have a difference of at least 1 eV. The imaging device further includes a transparent partition wall between adjacent color filters of adjacent pixels of the array. The partition wall is of a material having a lower refractive index than the material of the color filters.

By providing a charge blocking layer and specifying the difference between the ionization potential of the charge blocking layer and the electron affinity of the photoelectric layer as recited above, the solid state imaging apparatus of the invention has a reduced dark current and an improved SN ratio. Furthermore, the light transmitted through the color filters are effectively collected and led to the photoelectric layer, and color cross-talk is prevented from occurring between adjacent pixels.

The invention provides a solid state imaging device having a reduced dark current and an improved SN ratio and a method of making such a solid state imaging device.

BRIEF DESCRIPTION OF THE DRAWINGS

FIG. 26A and FIG. 26B each illustrate the state after the photoresist is patternwise exposed to light, developed, and post-baked.

FIG. 27A and FIG. 27B each illustrate the state after dry etching of the color filter layer of a first color.

FIG. 28A and FIG. 28B each illustrate color filters of a first color after removal of the photoresist.

FIG. 35A and FIG. 35B each illustrate a partition wall material layer formed.

FIG. 36A and FIG. 36B each illustrate the color filters of a first and a second color and partition walls coplanarized with each other.

FIG. 37A and FIG. 37B each illustrate a photoresist formed on the color filters of a first and a second color and the partition walls.

FIG. 38 illustrates the state after the photoresist is patternwise exposed to light, developed, and post-baked.

FIG. 39 illustrates the state after part of the partition walls is etched out to provide regions for a color filter layer of a third color.

FIG. 40A and FIG. 40B each illustrate the state after removal of the photoresist.

FIG. 47 represents a driving timing diagram of the readout circuit of the first example with an electronic shutter turned on.

FIG. 48 represents a driving timing diagram of the readout circuit of the first example with an electronic shutter turned on.

DETAILED DESCRIPTION OF THE INVENTION

Figure 1:
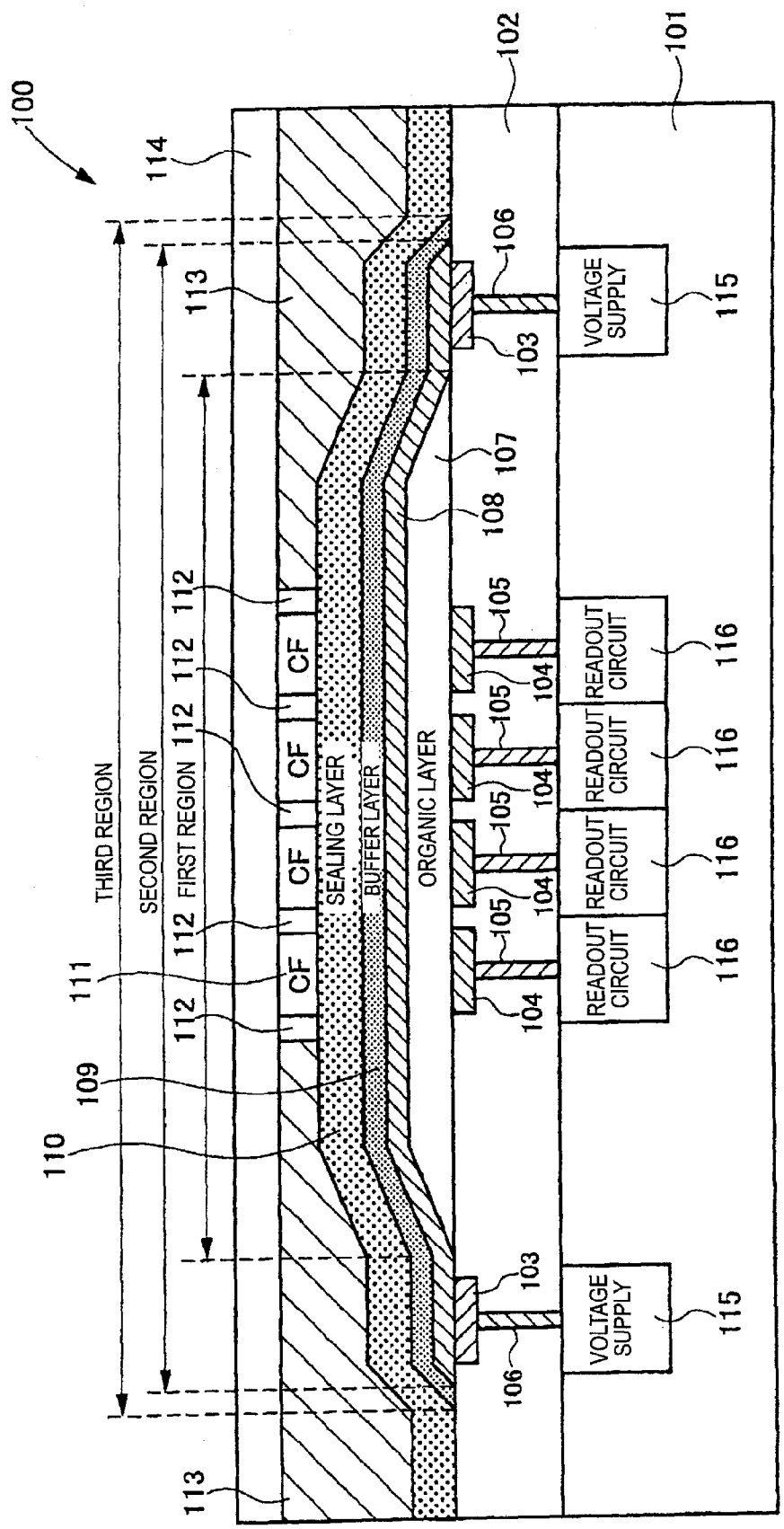
FIG. 1 is a schematic cross-section representing an example of the structure of the solid state imaging device according to the invention.

FIG. 1 is a schematic cross-section showing the structure of a tandem solid state imaging device 100.

The solid state imaging device 100 illustrated in FIG. 1 includes a substrate 101, a dielectric layer 102, connection electrodes 103, pixel electrodes 104, vertical interconnects 105, vertical interconnects 106, an organic layer 107, a counter electrode 108, a buffer layer 109, a sealing layer 110, color filters 111, partition walls 112, a light-shielding layer 113, a protective layer 114, a voltage supply 115 for supplying voltage to common electrode, and readout circuits 116.

The substrate 101 is a glass substrate or a semiconductor (e.g., Si) substrate. The dielectric layer 102 is formed on the substrate 101. A plurality of pixel electrodes 104 and a plurality of connection electrodes 103 are formed in the surface portion of the dielectric layer 102.

The organic layer 107 contains at least a photoelectric layer that generates charges in response to light received. The organic layer 107 is formed on the pixel electrodes 104 to cover them. The organic layer 107 has a uniform thickness on the pixel electrodes 104 but may have its thickness varied in the region other than the effective pixel area. The details of the organic layer will be described later. The organic layer 107 is not limited to a structure made solely of an organic material (s), and part of the layer structure may contain an inorganic material.

The counter electrode 108 is disposed opposite the pixel electrodes 104 to cover the organic layer 107. The counter electrode 108 is made of a conductive material transparent to incident light to let the incident light fall on the organic layer 107. The counter electrode 108 extends to cover the connection electrodes 103 disposed outside the organic layer 107 and is electrically connected to the connection electrodes 103.

The vertical interconnect 106, such as a via plug, is buried in the dielectric layer 102 to connect the connection electrode 103 and the voltage supply 115. The voltage supply 115 is formed in the substrate 101 and applies a prescribed voltage to the counter electrode 108 via the interconnect 106 and the connection electrode 103. In the case when the voltage to be supplied to the counter electrode 108 is higher than the power source voltage of the solid state imaging device 100, the power source voltage is raised to the prescribed voltage through a voltage booster, such as a charge pump.

Each pixel electrode 104 is an electrode for collecting charges generated in the organic layer 107 between the pixel electrode 104 and the counter electrode 108. The readout circuits 116 are formed in the substrate 101 in correspondence with the respective pixel electrodes 104 and read out signals in response to the charges collected in the respective pixel electrodes 104. Each readout circuit 116 is composed of a CCD circuit, an MOS circuit, a TFT circuit, and so on. The readout circuits 116 are shielded from light by an unshown light-shielding layer provided in the dielectric layer 102. The details of the pixel electrodes 104 and the readout circuits 116 will be described later.

The buffer layer 109 is provided on the counter electrode 108 to cover the counter electrode 108. The sealing layer 110 is provided on the buffer layer 109 to cover the buffer layer 109. The color filters 111 are disposed on the sealing layer 110 at positions corresponding to the respective pixel electrodes 104. The partition walls 112 are disposed between the color filters 111 to ensure light transmission efficiency of the color filers 111. The light shielding layer 113 is provided on the sealing layer 110 in the area other than the regions having the color filters 111 and the partition walls 112 to prevent light from entering the organic layer 107 in the area other the effective pixel area. The protective layer 114 is provided on the color filters 111, the partition walls 112, and the light-shielding layer 113 to protect the whole solid state imaging device. The details of the buffer layer 109, the sealing layer 110, the color filters 111, the partition walls 112, the light-shielding layer 113, and the protective layer 114 will be given later.

While in the structure of FIG. 1 the pixel electrodes 104 and the connection electrodes 103 are buried in the surface portion of the dielectric layer 102, they may be in the vicinity of the surface of the dielectric layer 102. While the structure of FIG. 1 has two sets of a connection electrode 103, an interconnect 106, and a voltage supply 115, there may be only one set. When the counter electrode 108 is supplied with a voltage from both ends thereof as in the case illustrated in FIG. 1, voltage reduction in the counter electrode 108 is suppressed. The number of the sets to be provided may be decided as appropriate in consideration of the chip area of the device.

The solid state imaging device 100 has a plurality of pixels. The pixels are arrayed two-dimensionally when viewed from the light incident side thereof. Each pixel includes at least a pixel electrode 104, the organic layer 107, the counter electrode 108 facing the pixel electrode 104, the sealing layer 110, the color filter 111, and the readout circuit 116.

The configuration of the peripheral circuitry will be described. For use in general image sensors, the readout circuit 116 is preferably a CCD circuit or a CMOS circuit. A CMOS circuit is more preferred in view of low noise and fast response. The peripheral circuitry used in the configuration described blow includes a CMOS circuit as the readout circuit 116.

Figure 2:
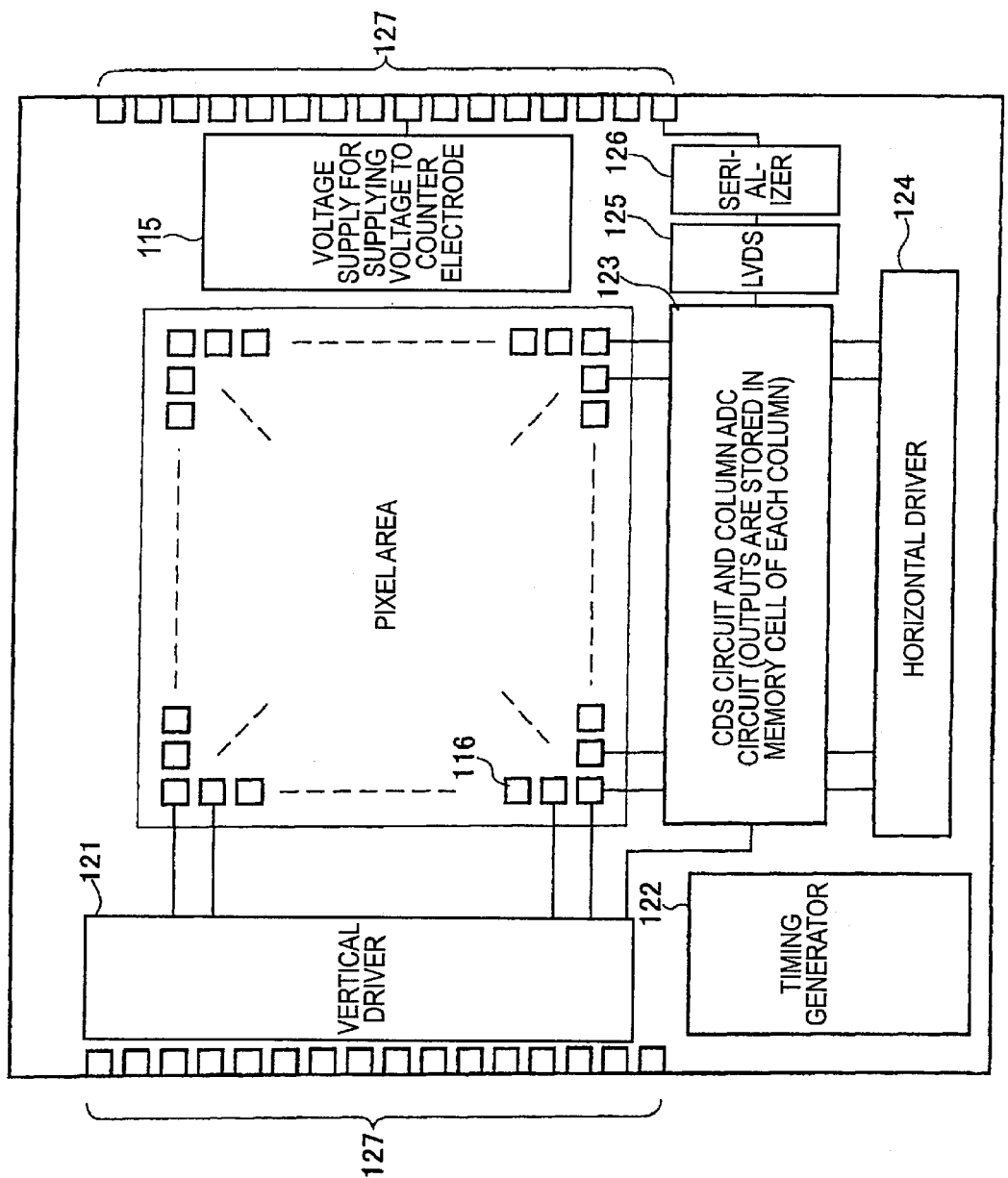
FIG. 2 shows a configuration of peripheral circuitry of a solid state imaging device.

FIG. 2 is the view of the whole configuration of the solid state imaging device of FIG. 1 including the peripheral circuitry. As illustrated in FIG. 2, the solid state imaging device 100 includes, in addition to the elements shown in FIG. 1, a vertical driver 121, a timing generator 122, a signal processing circuit 123, a horizontal driver 124, an LVDS circuit 125, a serializer 126, and pads 127.

The pixel area shown in FIG. 2 corresponds to a first region shown in FIG. 1. Each square in the pixel area represents a readout circuit 116. The peripheral circuitry used here may be almost the same peripheral circuitry used in general CMOS image sensors. The difference from the peripheral circuitry of general CMOS image sensors is the addition of the voltage supply 115 for the counter electrode.

The pad 127 is an interface for input and output of data with the outside. The timing generator 122 provides timing signals for driving the solid state imaging device and also executes readout control (such as a curtailed readout mode or a region-of-interest readout mode). The signal processing circuit 123 is associated with each column of the readout circuits 116. The signal processing circuit 123 performs correlated double sampling (CDS) on signals output from each column and converts the processed signals to digital form. The signals processed in the signal processing circuit 123 are stored in a memory cell for each column. The vertical driver 121 performs readout control for reading signals from the readout circuits 116. The horizontal driver 124 sequentially reads out signals of one row stored in the memory cells of the signal processing circuit 123 and output to the LVDS circuit 125. The LVDS circuit 125 transfers digital signals by low voltage differential signaling (LVDS). The serializer 126 converts parallel signals to serial signals.

The serializer 126 may be omitted. The signal processing circuit 123 may be configured to perform only correlated double sampling, and the LVDS circuit 125 may be replaced with an AD converter. It is also possible that the signal processing circuit 123 is configured to perform only correlated double sampling, and the LCDS circuit 125 and the serializer 126 are omitted. In this case, an AD conversion circuit is provided outside the chip having the solid state imaging device thereon. The signal processing circuit 123, the LVDS circuit 125, and the serializer 126 may be placed on both sides of the pixel area. In this case, half of the columns, e.g., odd number columns of the readout circuits 116 may be processed by the signal processing circuit 123 disposed on one side of the pixel area, with the remaining half, e.g., even number columns, by the other signal processing circuit 123 disposed on the other side.

The organic layer 107, the pixel electrodes 104, the counter electrode 108, the buffer layer 109, the sealing layer 110, the color filter layers 111, the partition walls 112, the light shielding layer 113, the protective layer 114, and the readout circuits 116 will be described in more detail.

Figure 3:
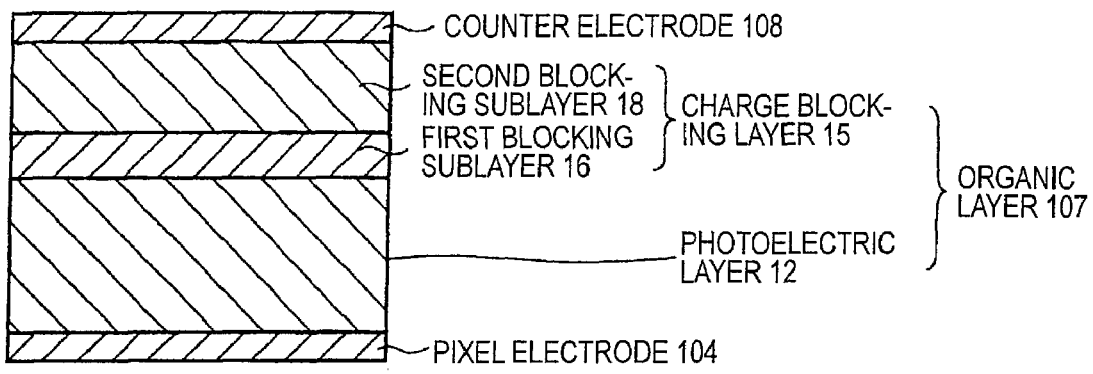
FIG. 3 illustrates a structure of an organic layer.

FIG. 3 is a fragmentary cross-section representing an example of the layer structure of the organic layer. The organic layer of FIG. 3 includes a photoelectric layer 12 and a charge blocking layer 15.

The charge blocking layer 15 functions to control a dark current. The charge blocking layer 15 is composed of a first blocking sublayer 16 and a second blocking sublayer 18.

Such a multi-layer charge blocking structure provides an interface between the first and second sublayers. The interface provides discontinuity of intermediate level between the sublayers. This interferes with movement of charge carriers through the intermediate level to control a dark current. The charge blocking layer 15 may have a single layer structure as in the other configurations given infra.

The photoelectric layer 12 contains an organic p type semiconductor and an organic n type semiconductor. The organic p type and n type semiconductors are joined to form a donor-acceptor interface to provide increased exciton dissociation efficiency. A photoelectric layer 12 having the organic p type and n type semiconductors joined together exhibits high photoelectric conversion efficiency. In particular, a photoelectric layer 12 having the organic p type and n type semiconductors mixed together provides a markedly increased junction interface to achieve increased photoelectric conversion efficiency.

The organic p type semiconductor (compound) is a donating organic semiconductor, i.e., an organic compound having electron donating character, which is mostly exemplified by a hole transporting organic material. In some detail, when two organic materials are used in contact with each other, the material having a smaller ionization potential is an electron donating compound. Any electron donating organic compound may be used, including triarylamine compounds, benzidine compounds, pyrazoline compounds, styrylamine compounds, hydrazone compounds, triphenylmethane compounds, carbazole compounds, polysilane compounds, thiophene compounds, phthalocyanine compounds, cyanine compounds, merocyanine compounds, oxonol compounds, polyamine compounds, indole compounds, pyrrole compounds, pyrazole compounds, polyarylene compounds, fused aromatic carbocyclic compounds (e.g., naphthalene derivatives, anthracene derivatives, phenanthrene derivatives, tetracene derivatives, pyrene derivatives, perylene derivatives, and fluoranthene derivatives), and metal complexes having a nitrogen-containing heterocyclic compound as a ligand. In addition, any organic compounds having a smaller ionization potential than an organic compound used as an n type, electron-accepting organic compound may be used as a donating organic semiconductor.

The organic n type semiconductor (compound) is an accepting organic semiconductor, i.e., an organic compound having electron accepting character, which is mostly exemplified by an electron transporting organic compound. In some detail, when two organic compounds are used in contact with each other, the compound having larger electron affinity is an electron accepting compound. Any compound having electron accepting character may be used, including fused aromatic carbocyclic compounds (e.g., naphthalene derivatives, anthracene derivatives, phenanthrene derivatives, tetracene derivatives, pyrene derivatives, perylene derivatives, and fluoranthene derivatives), nitrogen-, oxygen- or sulfur-containing 5- to 7-membered heterocyclic compounds (e.g., pyridine, pyrazine, pyrimidine, pyridazine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridazine, triazolopyrimidine, tetrazaindene, oxadiazole, imidazopyridine, pyralidine, pyrrolopyridine, thiadiazolopyridine, dibenzazepin, and tribenzazepin), polyarylene compounds, fluorene compounds, cyclopentadiene compounds, silyl compounds, and metal complexes having a nitrogen-containing heterocyclic compound as a ligand. In addition, any organic compounds having larger electron affinity than an organic compound used as an electron-donating (p type) organic compound may be used as an accepting organic semiconductor.

Any organic dyes may be used as an organic p type or n type semiconductor. Examples of preferred organic dyes include, but are not limited to, cyanine dyes, styryl dyes, hemicyanine dyes, merocyanine dyes (including zeromethine merocyanine (simple merocyanine)), trinuclear merocyanine dyes, tetranuclear merocyanine dyes, rhodacyanine dyes, complex cyanine dyes, complex merocyanine dyes, allopolar dyes, oxonol dyes, hemioxonol dyes, squarylium dyes, chroconium dyes, azamethine dyes, coumarin dyes, arylidene dyes, anthraquinone dyes, triphenylmethane dyes, azo dyes, azomethine dyes, spiro compounds, metallocene dyes, fluorenone dyes, flugide dyes, perylene dyes, perinone dyes, phenazine dyes, phenothiazine dyes, quinone dyes, indigo dyes, diphenylmethane dyes, polyene dyes, acridine dyes, acridinone dyes, diphenylamine dyes, quinacridone dyes, quinophthalone dyes, phenoxazine dyes, phthaloperylene dyes, diketopyrrolopyrrole dyes, dioxane dyes, porphyrin dyes, chlorophyll dyes, phthalocyanine dyes, metal complex dyes, and fused aromatic carbocyclic compound dyes (e.g., naphthalene derivatives, anthracene derivatives, phenanthrene derivatives, tetracene derivatives, pyrene derivatives, perylene derivatives, and fluoranthene derivatives).

Particularly preferred organic n type semiconductors are fullerenes and their derivatives for their excellent electron transport properties. Examples of fullerenes include fullerene $C_{60}$, $C_{70}$, $C_{76}$, $C_{78}$, $C_{80}$, $C_{82}$, $C_{84}$, $C_{90}$, $C_{96}$, $C_{82}$, $C_{84}$, $C_{90}$, $C_{96}$, $C_{240}$, and $C_{540}$, mixed fullerene, and fullerene nanotube. Fullerene derivatives are compounds derived from the fullerenes by addition of a substituent.

Examples of preferred substituents on fullerenes include alkyl groups, aryl groups, and heterocyclic groups. The alkyl group is preferably a C1 to C12 alkyl groups. Preferred examples of the aryl group and the heterocyclic group include a benzene ring, a naphthalene ring, an anthracene ring, a phenanthrene ring, a fluorene ring, a triphenylene ring, a naphthacene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a benzimidazole ring, an imidazopyridine ring, a quinolidine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring, and a phenazine ring. More preferred of them are benzene, naphthalene, anthracene, phenanthrene, pyridine, imidazole, oxazole, and thiazole rings. Even more preferred are benzene, naphthalene, and pyridine rings. The aryl group and the heterocyclic group may have one or more substituents, which may be the same or different and which may be connected to form a ring.

In the photoelectric layer 12 containing a fullerene or a fullerene derivative, electrons generated by photoelectric conversion are rapidly transported through the molecules of the fullerene or the fullerene derivative to the pixel electrode 104 or the counter electrode 108. When the molecules of the fullerene or the fullerene derivative are linked to form electron paths, the photoelectric layer exhibits improved electron transport properties to provide a photoelectric device having to a fast response time. Therefore, it is desirable that a fullerene or a fullerene derivative be present in the photoelectric layer 12 in an amount of 40% or more. It should be noted, however, that too high a content of a fullerene or a fullerene derivative means shortage of an organic p type semiconductor, which results in reduction of junction interface and reduction of exciton dissociation efficiency.

It is preferred to use a triarylamine compound described in Japanese Patent 4213832 as an organic p type semiconductor to be mixed with a fullerene or a fullerene derivative. Using the triarylamine compound brings about an improved SN ratio. If the content of a fullerene or a fullerene derivative in the photoelectric layer 12 is too high, the content of the triarylamine compound is relatively too low, resulting in reduction of light absorption and, consequently, reduction in photoelectric conversion efficiency. Therefore, the content of a fullerene or a fullerene derivative in the photoelectric layer 12 is preferably not more than 85%.

Each of the first blocking sublayer 16 and the second blocking sublayer 18 may be made of an organic, electron donating compound. Examples of organic, low molecular, electron donating compounds include aromatic diamine compounds, such as N,N'-bis(3-methylphenyl)-(1,1'-biphenyl)-4,4'-diamine and 4,4'-bis[N-(naphthyl)-N-phenylamino]biphenyl; oxazole, oxadiazole, triazole, imidazole, imidazolone, stilbene derivatives, pyrazoline derivatives, tetrahydroimidazole, polyarylalkanes, butadiene, 4,4',4''-tris(N-(3-methylphenyl)-N-phenylamino)triphenylamine; porphyrin compounds, such as porphine, tetraphenylporphine copper, phthalocyanine, copper phthalocyanine, and titanium phthalocyanine oxide; triazole derivatives, oxadiazole derivatives, imidazole derivatives, polyarylalkane derivatives, pyrazoline derivatives, pyrazolone derivatives, phenylenediamine derivatives, anilamine derivatives, amino-substituted chalcone derivatives, oxazole derivatives, styrylanthracene derivatives, fluorenone derivatives, hydrazone derivatives, and silazane derivatives. Examples of organic, high molecular, electron donating compounds include polymers of phenylene vinylene, fluorene, carbazole, indole, pyrene, pyrrole, picoline, thiophene, acetylene, diacetylene, etc. and derivatives thereof. Compounds that are not electron donative but have sufficient hole transporting properties may be used.

The charge blocking layer 15 may be made of an inorganic material. Using an inorganic material generally having a higher dielectric constant than organic materials in the charge blocking layer 15 allows applying much voltage to the photoelectric layer 12, resulting in increasing the photoelectric conversion efficiency. Examples of organic materials making the charge blocking layer 15 include calcium oxide, chromium oxide, chromium copper oxide, manganese oxide, cobalt oxide, molybdenum oxide, indium copper oxide, indium silver oxide, and iridium oxide.

In the case where the charge blocking layer 15 has a multi-layer structure, it is preferred that the charge blocking sublayer adjoining the photoelectric layer 12 be made of the same material as the organic p type semiconductor used in the photoelectric layer 12. By using the same organic p type semiconductor in the charge blocking layer 15, formation of an intermediate level in the interface between the photoelectric layer 12 and the adjoining layer is prevented, thereby further preventing a dark current.

In the case where the charge blocking layer 15 has a single layer structure, it may be made of an inorganic material. Where the charge blocking layer 15 has a multi-layer structure, one or more sublayers thereof may be of an inorganic material.

Figure 4:
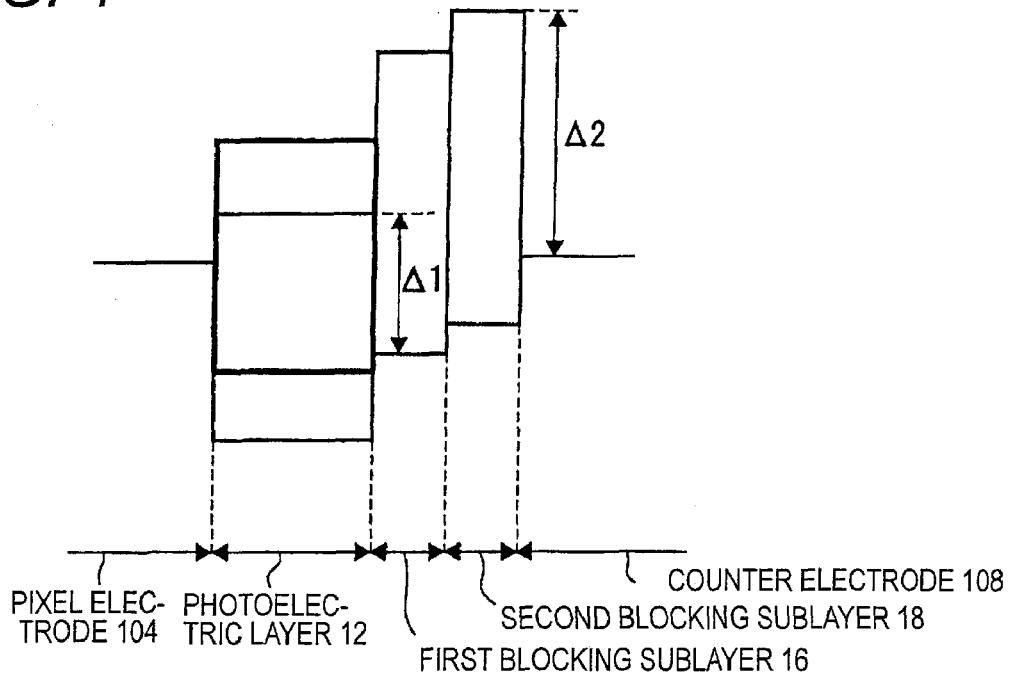
FIG. 4 is an energy band diagram of the photoelectric device illustrated in FIG. 3.

FIG. 4 is an energy band diagram of the photoelectric device illustrated in FIG. 3. Starting from the left, FIG. 4 shows the energy levels of the pixel electrode 104, the photoelectric layer 12, the first blocking sublayer 16, the second blocking sublayer 18, and the counter electrode 108. The following description about the views of FIGS. 3 and 4 applies as well to an unshown structure in which these elements are stacked in reverse order, i.e., in the order of the pixel electrode 104, the second blocking sublayer 18, the first blocking sublayer 16, the photoelectric layer 12, and the counter electrode 108.

The difference between the electron affinity Ea of the organic n type semiconductor contained in the photoelectric layer 12 and the ionization potential Ip of the first blocking sublayer 16 adjoining the photoelectric layer 12 is taken as $\Delta 1$. The difference between the electron affinity Ea of the second blocking sublayer 18 and the work function of the adjoining counter electrode 108 is taken as $\Delta 2$. In the case of the unshown structure having a reverse stacking order described above, the difference between the work function of the second blocking sublayer 18 and that of the adjoining pixel electrode 104 is taken as $\Delta 2$.

The photoelectric device illustrated in FIGS. 3 and 4 is able to prevent an increase in dark current when condition (a) below is satisfied. Prevention of an increase in dark current is ensured when not only condition (a) but conditions (b) and (c) are satisfied.

(a) The difference $\Delta 1$ between the ionization potential Ip of the first blocking sublayer 16 adjoining the photoelectric layer 12 and the electron affinity Ea of the organic n type semiconductor is 1 eV or more.

(b) The total thickness of the charge blocking layer including the first blocking sublayer and the second blocking sublayer 18 is 20 nm or more.

(c) The thickness of the first blocking sublayer 16 adjoining the photoelectric layer 12 is 10 nm or more.

Figure 5:
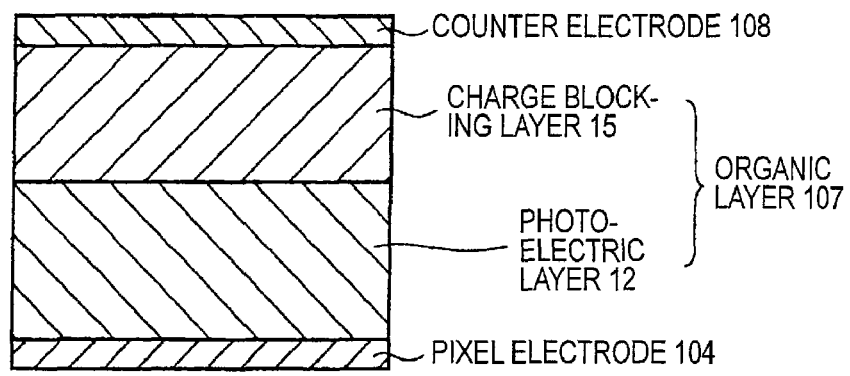
FIG. 5 illustrates another structure of an organic layer.
Figure 6:
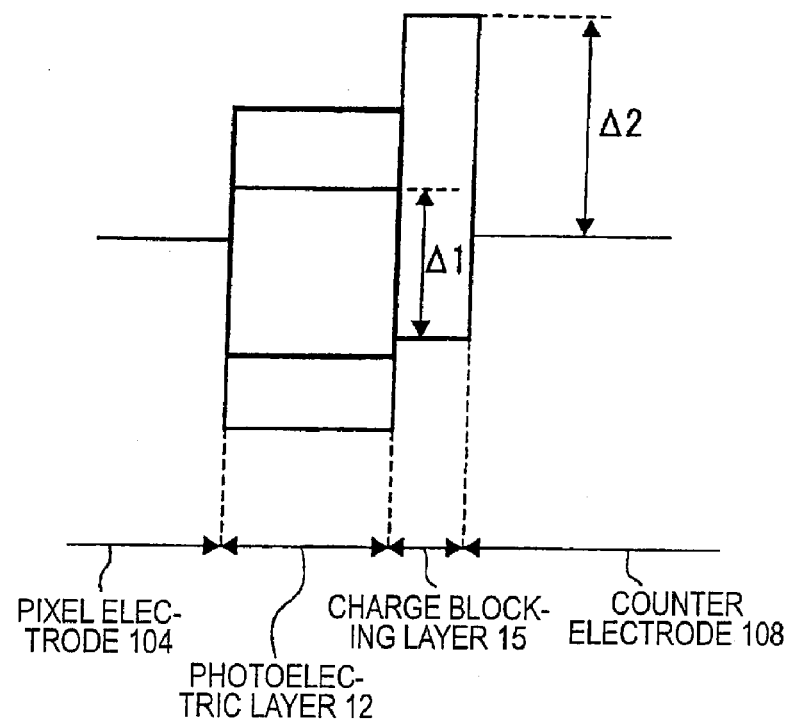
FIG. 6 illustrates an energy band diagram of the photoelectric device of FIG. 5.

FIG. 5 illustrates another structure of an organic layer 107. FIG. 6 is an energy band diagram of the photoelectric device of FIG. 5. The photoelectric device of FIG. 5 has a blocking layer 15 of a single layer structure. The following description about the view of FIGS. 5 and 6 applies as well to an unshown structure in which these elements are stacked in reverse order, i.e., in the order of the pixel electrode 104, the charge blocking sublayer 15, the photoelectric layer 12, and the counter electrode 108.

Where the charge blocking layer 15 has a single layer structure, the difference between the electron affinity Ea of the organic n type semiconductor present in the photoelectric layer 12 and the ionization potential Ip of the charge blocking layer 15 is taken as $\Delta 1$, and the difference between the electron affinity Ea of the charge blocking layer 15 and the work function of the counter electrode 108 is taken as $\Delta 2$. In the case of the unshown structure having a reverse order described above, the difference between the work function of the charge blocking layer 15 and that of the pixel electrode 104 is taken as $\Delta 2$.

The photoelectric device illustrated in FIGS. 5 and 6 is able to prevent an increase in dark current when condition (a) below is satisfied. Prevention of an increase in dark current is ensured when not only condition (a) but condition (b) is satisfied.

(a) The difference $\Delta 1$ between the ionization potential Ip of the charge blocking layer 15 and the electron affinity Ea of the organic n type semiconductor is 1 eV or more.

(b) The thickness of the charge blocking layer is 20 nm or more.

That is, the structures of FIGS. 3 and 5 having a single or multi-layer charge blocking layer 15 are able to control an increase of dark current when:

(a) the difference $\Delta 1$ between the ionization potential Ip of the charge blocking layer 15 (or the blocking sublayer adjoining the photoelectric layer 12 in the case when the charge blocking layer 15 has a multi-layer structure) and the electron affinity Ea of the organic n type semiconductor is 1 eV or more.

(b) the total thickness of the charge blocking layer 15 is 20 nm or more, and (c) the thickness of the blocking sublayer adjoining the photoelectric layer 12 is 10 nm or more (in the case when the charge blocking layer 15 has a multi-layer structure).

Each of the photoelectric devices of FIGS. 3 and 5 preferably has Δ2 of 1.3 eV or more so as to prevent electrons form being injected from the counter electrode 108 or the pixel electrode 104 into the photoelectric layer 12 to cause an increase in dark current.

The photoelectric device having the structure of FIG. 3 or 5 achieves improved photoelectric conversion efficiency on voltage application to the organic layer 107. The voltage to be applied is decided by the electric field intensity applied to the organic layer 107. The electric field intensity applied to the organic layer 107 is preferably $1 \times 10^3$ V·m$^{-1}$ or more, more preferably $1 \times 10^5$ V·m$^{-1}$ or more, even more preferably $1 \times 10^7$ V·m$^{-1}$ or more. However, the electric field intensity cannot be increased without limit because it can lead to a higher dark current, necessitate higher voltage application, and make design and fabrication of the circuitry containing the voltage supply 115 more complicated. The voltage to be applied should therefore be selected as appropriate for balance between SN ratio of the photoelectric device and the production cost of the solid state imaging device.

The pixel electrode 104 collects charge carriers, i.e., electrons or holes generated in the organic layer 107 including the photoelectric layer on the pixel electrode 104. The charge collected in each pixel electrode is converted to a signal in the respective readout circuit 116. An image is synthesized from the signals output from a plurality of pixels.

When the pixel electrode 104 forms a steep slope along its edge, when the pixel electrode has a considerably uneven surface, or when the pixel electrode has a dust particle attached thereto, the organic layer 107 on the pixel electrode 104 is thinner than designed or suffers from cracking. If the counter electrode 108 is formed on such a defective organic layer, the pixel electrode and the counter electrode can come into contact or an electric field can be concentrated at the defective portion, resulting in an increase of dark current and pixel defects due to, e.g., a short circuit. Therefore, it is preferred to reduce a step or level difference along the edge of the pixel electrode and unevenness of the pixel electrode surface. In order to remove particles from the pixel electrodes, it is particularly preferred that the substrate be cleaned by a cleaning technique generally employed in semiconductor fabrication prior to the formation of the organic layer 107.

To avoid the defects due to surface unevenness of the pixel electrodes thereby to improve device reliability, it is preferred for the pixel electrodes to have a surface roughness Ra of 0.5 nm or less. A smaller Ra value means smaller surface roughness and a better surface planarity. To remove particles from the pixel electrode surface, it is particularly preferred that the substrate be cleaned by a cleaning technique generally employed in semiconductor fabrication prior to the formation of the organic layer 107.

To prevent the defects due to the steep slope or a step or level difference along the edge of the pixel electrode, the edge structure of the pixel electrode is configured as follows.

Figure 7:
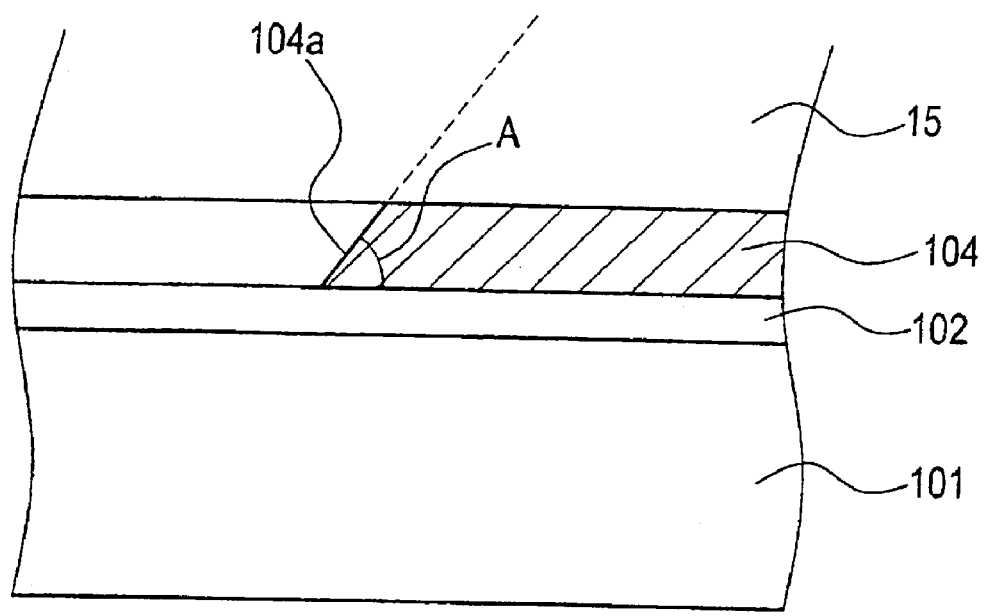
FIG. 7 is an enlarged schematic cross-section representing a configuration of a pixel electrode.

FIG. 7 is a schematic view showing a cross-section of the pixel electrode 104 and its neighboring layers. The pixel electrode 104 is formed above the substrate 101 with the dielectric layer 102 therebetween. In the structure shown, a charge blocking layer 15 is provided on the dielectric layer 102 to cover the pixel electrodes 104.

The edge of the pixel electrode 104 is preferably sloped. More preferably, the pixel electrode 104 has a slope 104a along its edge at a slope angle A of 50° or less with respect to the surface of the substrate 101 (inclusive of the dielectric layer 102). By providing such a slope along the edge of the pixel electrode, the defects of the organic layer will be reduced, and the adhesion between the pixel electrodes and the upper organic layer will be enhanced.

To reduce the level difference along the edges of the pixel electrode 104, it is preferred that the surface of the pixel electrode 104 and the surface of the dielectric layer 102a between the pixel electrodes are substantially coplanar with each other, namely, the pixel electrodes 104 and the surrounding dielectric layer be coplanarized. The configuration and technique enabling coplanarization of the pixel electrodes 104 will be illustrated below.

The configuration having the pixel electrodes 104 coplanarized is preferably achieved by multilevel interconnection technologies generally used in the semiconductor fabrication, such as standard CMOS image sensor processes, in view of reliability and production cost. Processes for making coplanarized pixel electrodes 104 include a trench isolation process and a damascene process. Which process is to be used is determined appropriately taking into consideration the material of the pixel electrodes 104, which material is decided in conjunction with the organic photoelectric material, and the fabrication cost.

Referring to FIGS. 8 through 11, the procedures for forming pixel electrodes by trench isolation technology will be explained.

Figure 8:
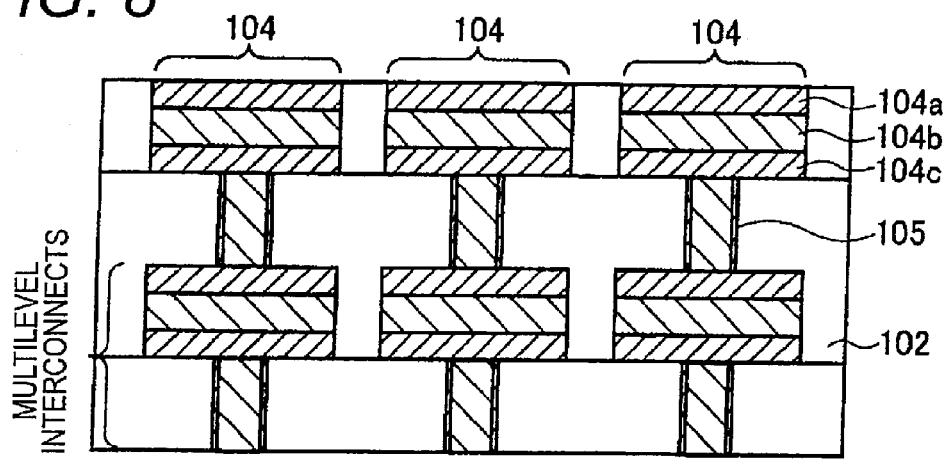
FIG. 8 illustrates a structure of a pixel electrode formed by trench isolation.

As illustrated in FIG. 8, provided above a multilevel interconnection array for readout circuits is a metal layer providing pixel electrodes 104, with an interlayer dielectric therebetween, by versatile semiconductor fabrication processes. Via-plugs (vertical interconnects 105) are previously formed in the interlayer dielectric at positions corresponding to where pixel electrodes, pads for connection to a counter electrode, bonding pads, etc. are to be formed. The metal layer preferably has the same structure as the multilevel interconnects for readout circuits in view of reliability and fabrication cost. The metal layer preferably has a three-layer structure of barrier metal sublayer/wiring metal sublayer/barrier metal sublayer. When, for example, aluminum (Al) is used as a wiring material, aluminum is preferably combined with titanium nitride (TiN) as barrier metal to make a three-layer structure of barrier metal sublayer 104a (TiN)/wiring metal sublayer 104b (Al)/barrier metal sublayer 104c (TiN).

Figure 9:
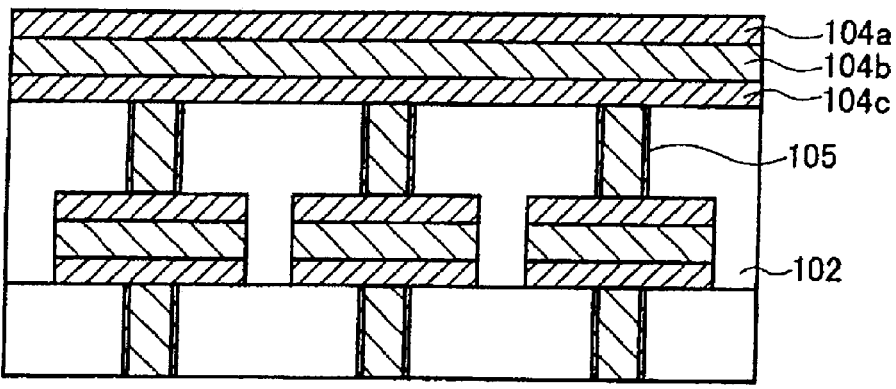
FIG. 9 illustrates a procedure for forming a pixel electrode by trench isolation.

As illustrated in FIG. 9, a barrier metal sublayer 104c, a wiring sublayer 104b, and a barrier metal sublayer 104a are stacked in that order on a dielectric layer 102 having multilevel interconnection circuits previously formed therein.

Figure 10:
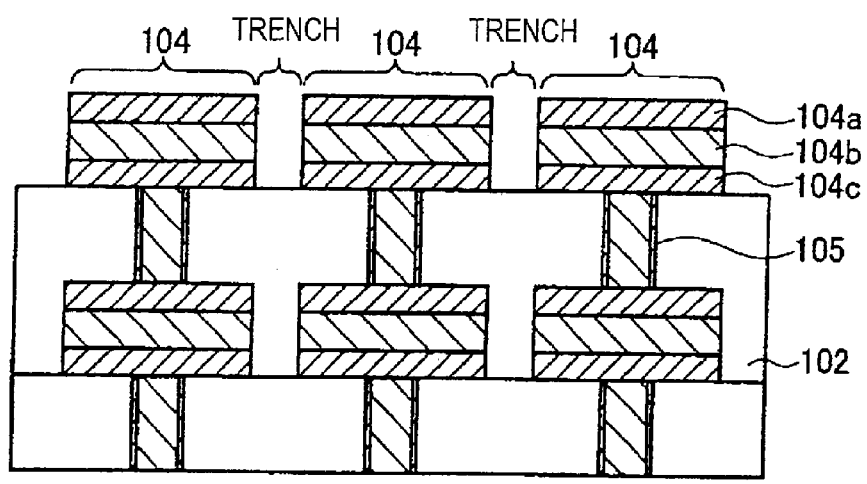
FIG. 10 illustrates a procedure for forming a pixel electrode by trench isolation

As illustrated in FIG. 10, the metal layer is removed from other than the portions where pixel electrodes 104, pads for connection to a counter electrode, bonding pads, and the like are to be formed by photolithography and dry etching techniques used in general multilevel interconnection technology. As a result, there are formed trenches around thus formed pixel electrodes 104 having a depth equal to the thickness of the metal layer.

Figure 11:
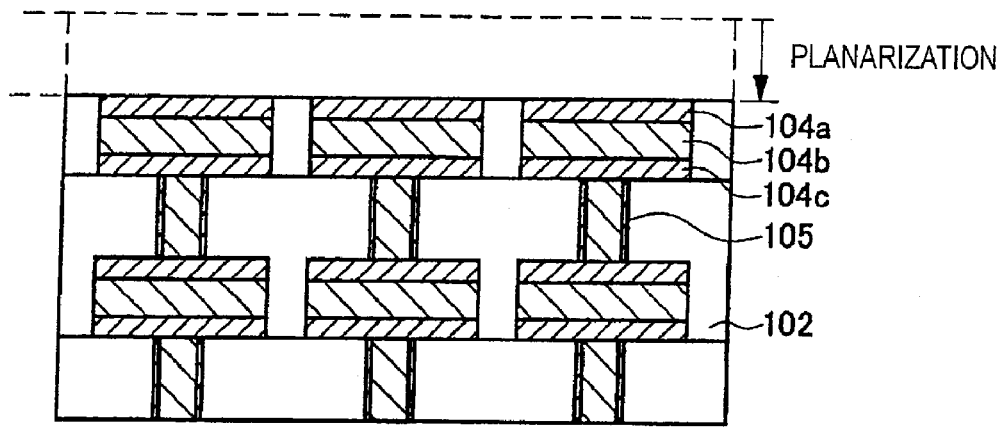
FIG. 11 illustrates a procedure for forming a pixel electrode by trench isolation.

As illustrated in FIG. 11, a dielectric layer is then provided on the metal layer having been patterned to form the pixel electrodes 104 by the multilevel interconnection technology. The dielectric layer is preferably formed of the same material of the interlayer dielectric used in the underlying multilevel interconnection arrays, which material is generally used in CMOS image sensor processes. Usually, a silicon oxide layer, a silicon nitride layer, a silicon oxynitride layer, or a stack thereof is used.

After the formation of the interlayer dielectric on the patterned metal layer, the interlayer dielectric is planarized by chemical mechanical polishing (CMP) or etch-back. The planarization is preferably carried out under the same CMP conditions as used in the underlying multilevel interconnection, which conditions are generally used in CMOS image sensor processes, in view of reliability and fabrication cost. While in multilevel interconnection CMP completes when the interlayer dielectric is reduced to a predetermined thickness, the polishing is further continued until the surface of the patterned metal layer (the pixel electrodes 104) is exposed. Because TiN constituting the barrier metal layer 104a, the top of the pixel electrodes 104, has a lower polishing rate than the surrounding interlayer dielectric, it serves as a polish-stop layer. At the end of CMP, there are obtained pixel electrodes the surface of which are substantially coplanar with the surface of the dielectric layer filling the trenches between the pixel electrodes. After the surface of the TiN layer is exposed, CMP may be continued to an extent that does not cause dishing of the trench fill material, whereby the surface of the TiN layer is polished to provide highly smoothed pixel electrodes 104.

Figure 12:
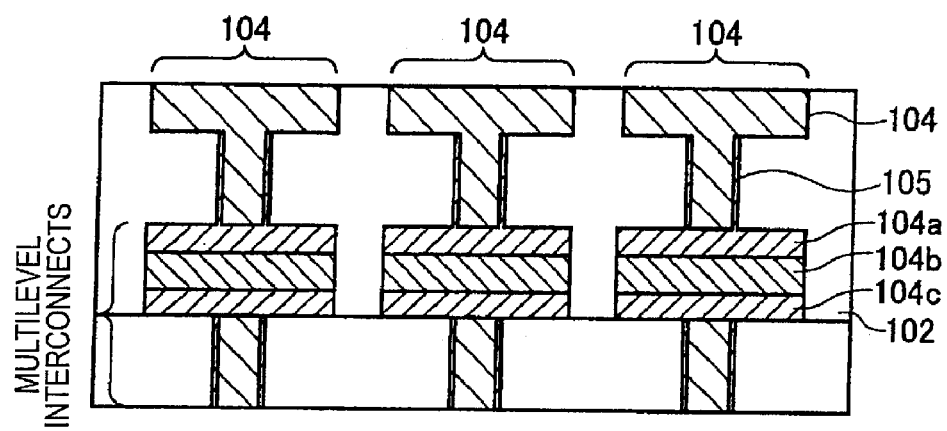
FIG. 12 illustrates a structure of a pixel electrode formed by a damascene process.

FIG. 12 represents the structure of pixel electrodes 104 formed by the damascene process. The pixel electrodes 104 are constituted by the same material as that of via plugs, e.g., tungsten. The surface of the pixel electrodes 104 is substantially coplanar with the surface of the dielectric layer 102.

Referring to FIGS. 13 through 16, the procedures for forming pixel electrodes by the damascene process will be described.

Figure 13:
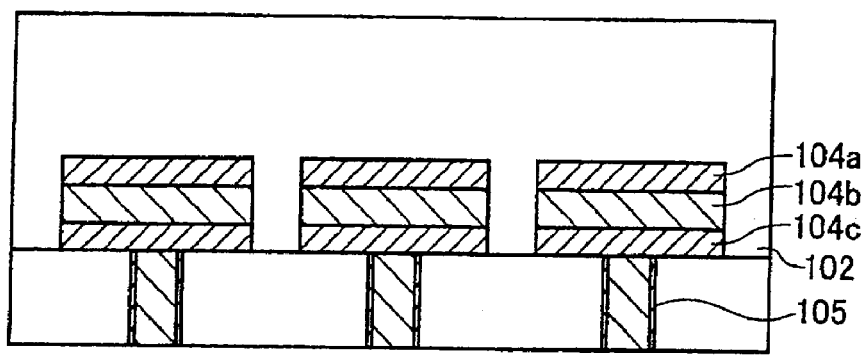
FIG. 13 illustrates a procedure for forming a pixel electrode by a damascene process.

As shown in FIG. 13, on the multilevel interconnection arrays for readout circuits is formed an interlayer dielectric using the same dielectric material as used in the underlying multilevel interconnection arrays, and the surface of the interlayer dielectric is planarized by, for example, CMP.

Figure 14:
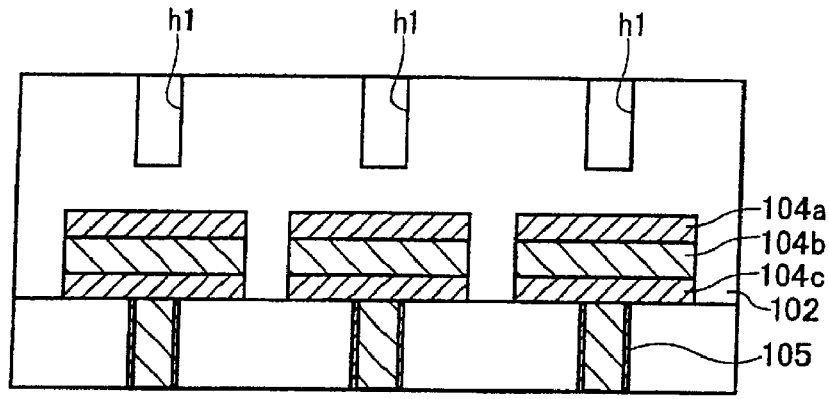
FIG. 14 illustrates a procedure for forming a pixel electrode by a damascene process.

As illustrated in FIG. 14, via holes h1 are formed in the interlayer dielectric by photolithography and dry etching techniques used in multilevel interconnection technology. The via holes h1 are formed at positions where pixel electrodes 104, pads for connection to a counter electrode, bonding pads, and the like are to be formed for connection to the underlying multilevel interconnects. In the case where a dual damascene process is adapted, etching of the interlayer dielectric for making the holes at positions where pixel electrodes 104 are to be formed is stopped short of reaching the underlying multilevel interconnects by the thickness of each pixel electrode 104 to be formed. It is preferred that the interlayer dielectric have more than one sublayers of materials different in etching rate adjoining at the depth short of reaching the underlying multilevel interconnects by the thickness of the pixel electrode 104. The lower sublayer of the layered insulating layer will serve as an etch-stop layer to prevent variation of etching.

Figure 15:
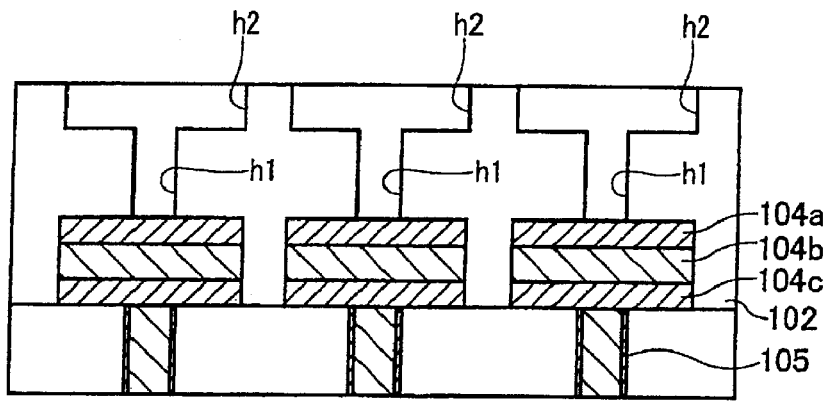
FIG. 15 illustrates a procedure for forming a pixel electrode by a damascene process.

Subsequently, as illustrated in FIG. 15, recesses h2 connecting to the holes h1 and conforming the shape of each pixel electrode 104, pads for counter electrode, bonding pads, etc. are made by photolithography and dry etching techniques. The etching is conducted to a depth corresponding to the thickness of the pixel electrodes 104, whereby the holes 1 at the positions of pixel electrodes are further etched to reach the underlying multilevel interconnects.

Figure 16:
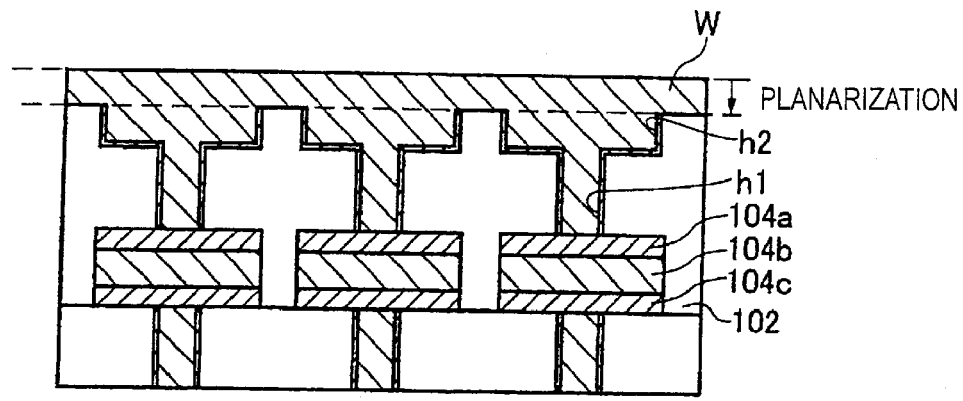
FIG. 16 illustrates a procedure for forming a pixel electrode by a damascene process.

In view of reliability and fabrication cost, it is preferred to use the same via-plug material as used in the underlying multilevel interconnects to fill the via holes h1 and holes h2 and to cover the surface of the interlayer dielectric by deposition as illustrated in FIG. 16. The via plug material is usually deposited by chemical vapor deposition (CVD) of copper or tungsten. Before the deposition of the via plug material, a barrier metal, such as TiN, is previously deposited on the inner walls of the via holes h1 and the holes h2 by sputtering or CVD. As illustrated in FIG. 16, the deposited via plug material layer is planarized by CMP or etch back until the interlayer dielectric, which serves as a stop layer, is exposed. As a result, there are formed pixel electrodes 104 made of the via plug material the surface of which is substantially coplanar with the surface of the dielectric layer 102.

The step or level difference between pixel electrodes and the surrounding dielectric layer is thus eliminated, and an increase of dark current and occurrence of a short circuit defect are avoided in the solid state imaging device having a stack of an organic layer. Since a standard multilevel interconnection material is used as a pixel electrode material, the pixel electrodes 104 also play a role as a light shielding layer that prevents stray light from entering the readout circuits. The pixel electrodes 104 also reflect incident light to the organic layer side to increase utilization efficiency of incident light.

Back to FIG. 1, the counter electrode 108 is coupled to the pixel electrodes 104 to sandwich the organic layer 107 including a photoelectric layer therebetween. The counter electrode applies an electric field to the organic layer 107 and collects charges having opposite polarity to the polarity of the signal charges collected by the pixel electrodes 104. Because the collected charges whose polarity is opposite to that of the signal charges do not need to be divided among pixels, the counter electrode 108 is shared by the plurality of pixels and therefore called a common electrode.

The counter electrode 108 is preferably formed of a transparent conductor so as to let incident light be transmitted therethrough into the organic layer 107 including a photoelectric layer. Examples of transparent conductors include metals, metal oxides, metal nitrides, metal borides, organic conductive compounds, and mixtures thereof. Specific examples thereof include conductive metal oxides, such as tin oxide, zinc oxide, indium oxide, indium tin oxide (ITO), indium zinc oxide (IZO), indium tungsten oxide, and titanium oxide; metal nitrides, such as titanium nitride; metals, such as gold, platinum, silver, chromium, nickel, and aluminum; mixtures or laminates of the metal and the conductive metal oxide; organic conductive materials, such as polyaniline, polythiophene, and polypyrrole; and laminates of ITO with the organic conductive material. Particularly preferred materials of the counter electrode 108 are ITO, IZO, tin oxide, antimony-doped tin oxide, fluorine-doped tin oxide, zinc oxide, antimony-doped zinc oxide, and gallium-doped zinc oxide.

When the readout circuits 116 are of CMOS type, the surface resistivity of the counter electrode 108 is preferably 10 kΩ/sq. or less, more preferably 1 kΩ/sq. or less. When the readout circuits 116 are CCD circuits, the surface resistivity of the counter electrode 108 is preferably 1 kΩ/sq. or less, more preferably 0.1 kΩ/sq. or less.

The sealing layer 110 is required to satisfy the following conditions.

(1) To protect the photoelectric layer, the sealing layer 110 should inhibit penetration of photoelectric material-deteriorating factors contained in a solution, a plasma, etc. used in the tandem solid state imaging device fabrication.

(2) To prevent deterioration of the photoelectric layer during long time storage and use, the sealing layer 110 should inhibit penetration of photoelectric material-deteriorating factors, such as water molecules, after the tandem solid state imaging device fabrication.

(3) The sealing layer 110 should be formed under conditions that do not deteriorate the photoelectric layer already formed.

(4) To let incident light reach the photoelectric layer via the sealing layer 110, the sealing layer 110 must be transparent to the light rays having wavelengths detectable by the photoelectric layer.

The sealing layer 110 may have a single layer structure or a multilayer structure composed of sealing sublayers performing the respective functions. A multilayer structure is expected to provide advantages such that the stress of the whole sealing layer 110 is relaxed; occurrence of defects caused by dust during the fabrication, such as a crack and a pinhole, is minimized; and optimum material design is provided. For instance, the sealing layer 110 may have a dual layer structure having a first sealing sublayer that performs the essential function of inhibiting penetration of deteriorating factors, such as water molecules, and a second sealing sublayer (an auxiliary sealing sublayer) provided on the first sealing sublayer, the second sealing sublayer being designed to perform any function that is difficult to achieve by the first sealing sublayer. The number of the sublayers may be three or even more but is limited by considerations of cost.

The presence of a deteriorating factor, such as water molecules, deteriorates an organic photoelectric material considerably. It is therefore necessary to cover and seal the photoelectric layer with a water-impermeable dense material, such as ceramics including metal oxides, metal nitrides, and metal oxynitrides, and diamond-like-carbon. It is a generally followed practice to form a sealing layer of aluminum oxide, silicon oxide, silicon nitride, silicon oxynitride, or a stack thereof, or a laminate of such a ceramic layer and an organic polymer by various vacuum deposition techniques. According to these conventional film formation processes, however, a step on the substrate due to, for example, a structure of the substrate surface, a micro defect on the substrate surface, or a particle attached to the substrate surface blocks deposition and makes film growth difficult. As a result, the film deposited over the step is remarkably thinner than a flat area of the film and can provide a channel for allowing the deteriorating factor to penetrate. In order to completely cover the step with a sealing layer, it is necessary to form the sealing layer with such a large thickness that the thickness of the flat area may be at least 1 µm.

In the case of a tandem solid state imaging device having a pixel size of less than 2 µm, particularly about 1 µm, if the distance between a color filter and the photoelectric layer, namely the thickness of the sealing layer is large, incident light can diffract and/or diffuse in the sealing layer 110, resulting in color cross-talk or color mixing. It is therefore necessary, with a tandem solid state imaging device having a pixel size of about 1 µm, that a material and method for forming a sealing layer be selected so that the device performance may not deteriorate even with the thickness of the sealing layer reduced.

Atomic layer deposition (ALD), one of CVD processes, is a thin film formation technique consisting of alternately repeating adsorption and reaction of an organometallic compound molecules, metal halide molecules, or metal hydride molecules to and on the surface of a substrate and decomposition of any unreacted group of the reaction product. Since the film-forming material is a low molecular compound when it reaches the substrate, the deposit is able to grow only if there is a space in which small molecules are allowed to diffuse. Thus, the step on the substrate surface, which is due to a structure of the substrate surface, a micro defect on the substrate surface, or a particle attached to the substrate surface, is completely covered to form a deposit equally thick on both the step and the flat area. In short, ALD demonstrates excellent step coverage and prevents the step from providing a penetration path for the photoelectric material-deteriorating factor. ALD allows for reducing the effective thickness of the sealing layer 110 compared with the thickness of the sealing layer formed by other conventional film formation techniques.

When the sealing layer 110 is formed by ALD, the precursor materials to be used in ALD are appropriately selected from those providing the preferred ceramics described supra. Nevertheless, since the photoelectric layer to be sealed contains an organic photoelectric material, the ALD precursor materials are limited to those capable of growing into film at relatively low temperatures so as to avoid thermal deterioration of the organic photoelectric material. ALD using an alkylaluminum or an aluminum halide as a precursor provides a capability of growing a dense aluminum oxide film at temperatures lower than 200° C. that dot not cause deterioration of the underlying organic photoelectric material. ALD using trimethylaluminum is particularly preferred; for it provides a capability of growing an aluminum oxide film at around 100° C. Similar to an aluminum oxide film, a dense film of silicon oxide or titanium oxide may also be formed by ALD at temperatures lower than 200° C. by proper selection of the precursor material.

While ALD is a unique technique providing a capability of forming an excellent thin film incomparable in terms of step coverage and denseness at low temperatures, the physical properties of the resulting film can deteriorate by a chemical used in subsequent photolithography. For example, because an aluminum oxide film formed by ALD is amorphous, it will be corroded by an alkaline solution such as a developer or a stripper. In such a case, a chemical resistant film must be provided on the ALD aluminum oxide film. That is, the sealing layer 101 must have a dual layer structure composed of a first sealing sublayer and an auxiliary sealing sublayer (second sealing sublayer) for protecting the first sealing sublayer. It is preferred to form an auxiliary sealing sublayer containing any one of ceramics having high chemical resistance, such as a metal oxide, a metal nitride, or a metal oxynitride, to easily provide a sealing layer with improved chemical resistance.

A thin film formed by a CVD process such as ALD often has a large inner tensile stress and can undergo cracking as a result of intermittent repetition of heating and cooling as encountered in semiconductor fabrication or during long term storage or use in a high temperature or high humidity environment.

To overcome the problem with the sealing layer 110 formed by ALD, it is preferred to provide an auxiliary sealing sublayer containing any one of ceramics having high chemical resistance, such as a metal oxide, a metal nitride, or a metal oxynitride, by physical vapor deposition (PVD), such as sputtering. The ALD film is a first sealing sublayer, and the PVD film containing any one of a metal oxide, a metal nitride, and a metal oxynitride is a second sealing sublayer. Such a dual layer structure easily provides a sealing layer with improved chemical resistance. A ceramic film formed by PVD such as sputtering often has a large compressive stress, which will offset the tensile stress of the first sealing sublayer formed by ALD. The stress of the sealing layer 110 is thus relaxed as a whole. This not only improves the reliability of the sealing layer 110 itself but also appreciably prevents deterioration or breakage of the photoelectric layer that may occur due to the stress of the sealing layer 110. Relaxation of the stress of the sealing layer 110 leads to reduction of dark current.

It is particularly preferred that the sealing layer 110 have a dual layer structure composed of a first sealing sublayer and a second sealing sublayer containing one of aluminum oxide, silicon oxide, silicon nitride, and silicon oxynitride formed on the first sealing sublayer by sputtering.

The first sealing sublayer of the sealing layer 110 preferably has a thickness of 0.05 to 0.2 μm. The first sealing sublayer preferably contains one of aluminum oxide, silicon oxide, and titanium oxide.

The buffer layer 109 adsorbs and/or reacts with an organic photoelectric material-deteriorating factor, such as water molecules, to prevent the deteriorating factor from reaching the underlying organic photoelectric material. Otherwise, the deteriorating factor can penetrate through micro defects of the sealing layer 110 that are caused by the dust generated during the fabrication of the device and difficult to avoid completely. In addition, since the dense ceramic material used as the sealing layer 110 has a large stress, the stress tends to be concentrated particularly at the edge of the photoelectric layer. As a result, long term storage and/or use of the device or intermittent thermal shocks such as heating and cooling applied in the fabrication of the device can cause a contact between the counter electrode and the pixel electrode or delamination of the photoelectric layer. The buffer layer 109 also functions to relax the stress of the sealing layer 110. The buffer layer 109, being formed above the photoelectric layer, is required to be of a transparent material.

Examples of materials useful to make the buffer layer having the properties described include organic materials, including polymers, such as polyvinyl alcohol, and organic semiconductors used as a photoelectric material; and inorganic materials, including metal fluoride, such as calcium fluoride, magnesium fluoride, and lithium fluoride, and metal oxides, such as calcium oxide, silicon oxide, strontium oxide, barium oxide, and magnesium oxide.

In the cases where the sealing layer 110 covering the buffer layer 109 is to be formed by ALD, the buffer layer 109 is preferably made of an organic polymer having a hydroxyl group or a metal oxide with which the ALD precursor material, such as an organometallic compound or a metal halide, is reactive. It is more preferred for the buffer layer 109 to contain one of silicon oxide, silicon nitride, and silicon oxynitride. If the buffer layer 109 is formed as a continuous film over the entire substrate, the buffer layer 109 would rather allow the deteriorating factor such as water to enter the photoelectric layer from the end of the substrate. Therefore, it is preferred that the buffer layer 109 be provided as a patterned film over an area just enough to cover the photoelectric layer and be completely covered with the sealing layer 110 together with the photoelectric layer and the counter electrode 108. It is particularly preferred that such a patterned layer be formed of a metal oxide by a PVD process capable of patterning using a metal mask, such as vacuum evaporation or sputtering. Forming the buffer layer 109 by PVD which is carried out in vacuo is also advantageous from the standpoint that the substrate is protected from contact with the outside air so that the deteriorating factor such as water is prevented from entering to deteriorate the organic photoelectric material during the film formation.

In order to prevent organic layer-deteriorating factors such as water molecules from entering, it is preferred that at least the organic layer 107, the counter electrode 108, the buffer layer 109, and the sealing layer 110 be formed under vacuum and/or in an inert gas atmosphere so as to protect the substrate from any contact with an outer air. It is particularly preferred to use an apparatus used in the organic EL device fabrication having a vacuum evaporation unit for forming a charge blocking layer, a photoelectric layer, and the buffer layer 109, a sputtering unit for forming the counter electrode 108 and the auxiliary sealing sublayer of the sealing layer 110, and an ALD unit for forming the sealing layer 110 directly connected to a cluster vacuum transfer system having a degree of vacuum of $1\times10^{-4}$ Pa or less, in which film formation is performed in vacuo and/or in an inert gas (e.g., Ar or $N_2$) without any contact of the substrate with an outer air.

The plurality of pixels have the respective color filters. The partition walls disposed between adjacent color filters of adjacent pixels also function to collect and focus the light incident on the pixels onto the photoelectric layer. The process for forming the color filter array includes the steps of forming a peripheral light-shielding layer, forming a color filter layer of a first color, forming a color filter layer of a second color, forming a color filter layer of a third color, and forming partition walls. A color filter layer of any one of the first to third colors may be formed on the area out of the effective pixel area to serve as a peripheral light shielding layer. In that case, the step of separately forming the peripheral light shielding layer is omitted, which leads to reduction of cost. The step of forming partition walls may be carried out after any one of the steps of forming a peripheral light shielding layer, forming a color filter layer of a first color, forming a color filter layer of a second color, and forming a color filter layer of a third color, which is selected as appropriate to the combination of film formation techniques and processes.

Fabrication of color filters will be described concretely taking, for instance, forming partition walls after the step of forming a color filter layer of a second color.

Photolithography has been widely used as a process for forming color filters because the steps involved are similar to those for the semiconductor fabrication so that the initial investment may be reduced. The photolithographic process of forming color filters includes applying and drying a photosensitive composition containing a colored curing composition on a substrate to form a thin film, patternwise exposing the film, developing the exposed film, and baking the residual film. This process is repeated for each color. The photolithographic process may easily be applicable to the invention in conjunction with known techniques.

Dry etching is also used as an effective process providing capability of forming a thinner color filter and suitability for micropatterning as compared with the photolithographic process. Unlike the colored curing composition used in the photolithographic process, a colored curing composition used in a dry etching process does not need to contain a photosensitive composition containing a photo initiator and a monomer or an alkali-soluble resin and is allowed to have an increased colorant content on a solid basis. A dry etching process allows for forming a color filter with a halved thickness and equal spectral characteristics compared with the photolithographic process. To use the dry etching process is recommended to form color filters in the fabrication of a solid state imaging device having a pixel size of smaller than 2 μm, particularly about 1 μm, which often suffers from noticeable color crosstalk.

Color filter production by dry etching will be illustrated with reference to FIGS. 17 through 41. The step of forming color filters of a first, a second, or a third layer by dry etching includes the substeps of patterning a photoresist, etching, removing the photoresist, forming a color filter layer, and planarizing. The planarizing substep in the formation of a color filter layer of a first color and/or a color filter layer of a second color may be omitted, in which case the color filter layer of a first color and/or the color filter layer of a second color is/are planarized simultaneously with planarization of a color filter layer of a third color. By this omission, the number of procedures required is reduced. It is important, nevertheless, to determine whether omission of the substep of planarizing is appropriate or not with due consideration to the fabrication technique or process employed because planarization of the color filter layers of three colors at one time is accompanied by variations of the results of each etching substep and the planarization substep. In the example described below, the substep of planarizing a color filter layer of a first color is omitted.

Figure 17:
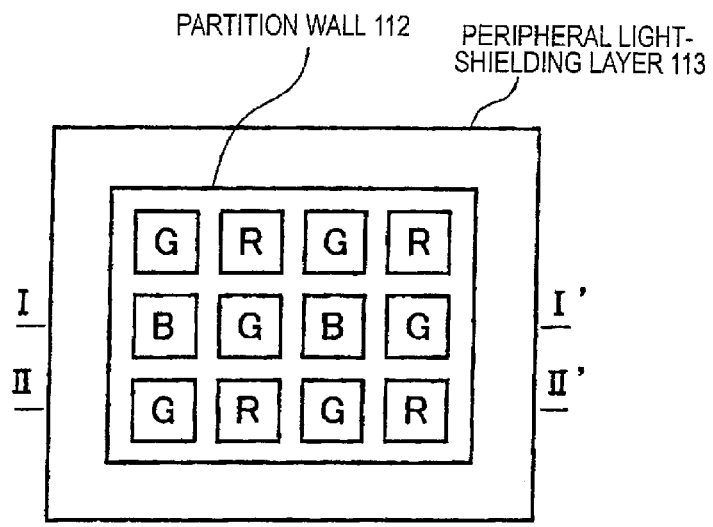
FIG. 17 is a plan of a color filter array.
Figure 18A:
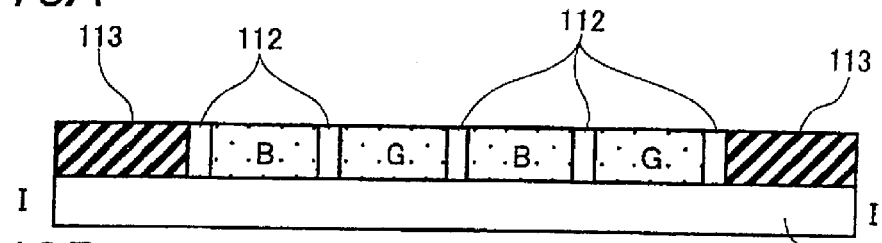
FIG. 18A and FIG. 18B are each a cross-section of the color filters of FIG. 17.
Figure 18B:
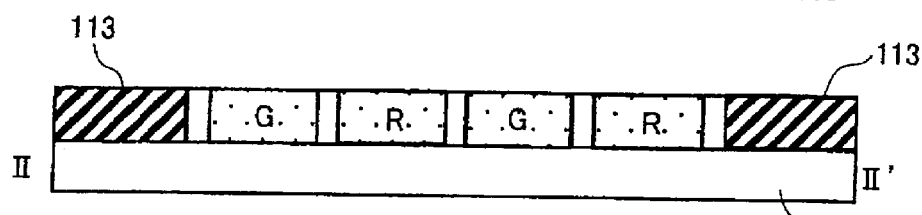

FIG. 17 is a plan view of an arrangement of color filters, which are formed by the procedures described hereunder. For the sake of simplicity, the configuration shown in FIG. 17 has fewer pixels than in practice. FIG. 18A and FIG. 18B are cross-sections of the color filters of FIG. 17, of which FIG. 18A is along line I-I', and FIG. 18B is along line II-II'. Likewise, of FIGS. 19 through 41, those suffixed with A are cross-sections along line I-I', and those suffixed with B are cross-sections along line II-II'. As illustrated in FIG. 17, partition walls 112 are provided to surround each pixel to make a grid as a whole when seen from above.

As illustrated in FIGS. 18A and 18B, the solid state imaging device of the invention includes a partition wall between adjacent color filters of adjacent pixel electrodes. The partition wall is made of a transparent material having a lower refractive index than the material of the color filters. By so designing the partition walls, color cross-talk is prevented from occurring between adjacent pixels.

FIGS. 19 through 23 illustrate the step of forming a peripheral light shielding layer.

Figure 19A:
FIG. 19A and FIG. 19B each illustrate a peripheral light-shielding layer formed.
Figure 19B:
Figure 20A:
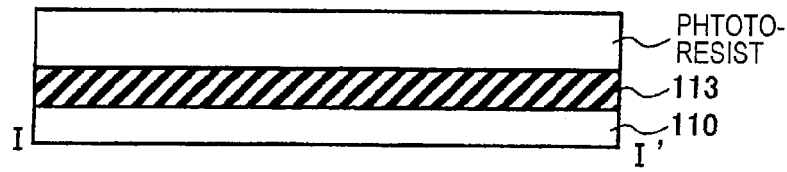
FIG. 20A and FIG. 20B each illustrate a photoresist formed on the peripheral light-shielding layer.
Figure 20B:
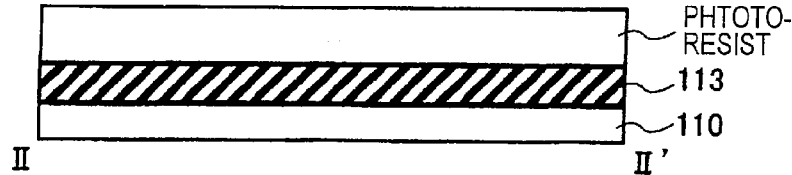
Figure 21A:
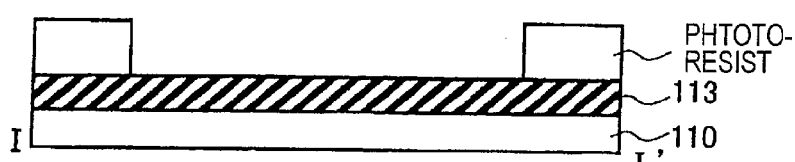
FIG. 21A and FIG. 21B each illustrate a state after the photoresist is patternwise exposed to light, developed, and post-baked.
Figure 21B:
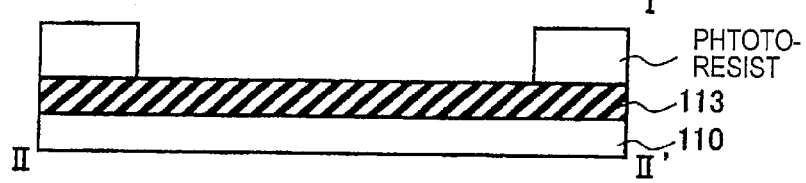
Figure 22A:
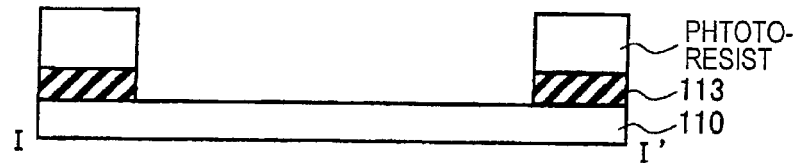
FIG. 22A and FIG. 22B each illustrate a peripheral light-shielding layer after having been dry etched.
Figure 22B:
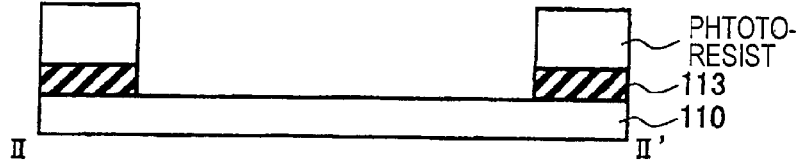
Figure 23:
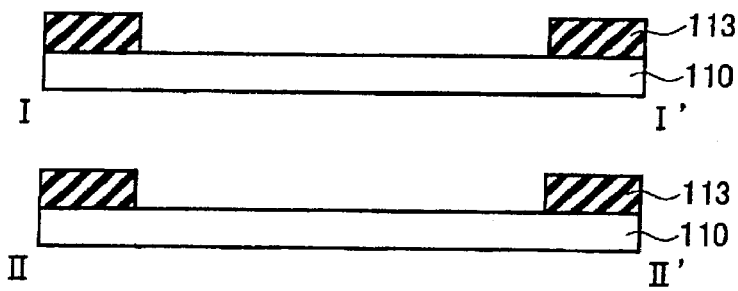
FIG. 23 illustrates the peripheral light-shielding layer after removal of the photoresist.

FIGS. 19A and 19B show a peripheral light shielding layer 113 formed on the sealing layer 110. FIGS. 20A and 20B show a photoresist formed on the peripheral light shielding layer 113. FIGS. 21A and 21B illustrate the photoresist having been patterned. FIGS. 22A and 22B illustrate the peripheral light shielding layer 113 having been dry etched. FIG. 23 shows the dry etched light shielding layer after removal of the photoresist.

In the step of forming a peripheral light shielding layer, a composition containing a black colorant is applied on the entire surface of the sealing layer 110 as illustrated in FIGS. 19A and 19B. The coating layer is cured by heating on a pot plate at an environmental temperature of 180° to 250° C. for 5 to 10 minutes to form a peripheral light shielding layer 113 (black colored layer). The heating may be effected either simultaneously with drying after application or in a separately provided substep of curing following drying. The peripheral light shielding layer 113 is preferably made of a dispersion of a black colorant, such as titanium black or carbon black. The peripheral light shielding layer 113 may be made use of as a polish-stop layer in planarizing color filter layers of three colors at a time as will be described later. When such is intended, the composition forming the peripheral light shielding layer may contain inorganic particles of, e.g., aluminum oxide, silicon oxide, or zirconium oxide, to have improved polish resistance. In the case when a color filter layer of any one of the three colors is provided to serves as a peripheral light shielding layer, the above described step of forming a peripheral light shielding layer is unnecessary.

In the area out of the effective pixel area, the organic layer 107 forms a step (level difference) along its edge. It can follow that the peripheral light shielding layer 113 formed thereon also has a step along the corresponding location. Then, particularly when the peripheral light shielding layer 113 doubles as a polish stop layer, it is preferable that the peripheral light shielding layer 113 be formed with a larger thickness than necessary and planarized to eliminate the step beforehand.

The step of forming a peripheral light shielding layer is followed by the steps of sequentially forming color filters of first to third colors. In the following example, a first color is red (R), a second color is blue (B), and a third color is green (G).

The step of forming color filters of a first color (R) starts with a substep of patterning a photoresist. As illustrated in FIG. 20, a positive photoresist material (e.g., FHi622BC, from Fujifilm Electronics Materials Co., Ltd.) is applied on the peripheral light shielding layer 113 and prebaked on a hot plate at 80° to 100° C. for 60 seconds to form a photoresist.

The area of the photoresist corresponding to the effective pixel area, where the color filters of the first to third colors are to be arrayed, is exposed to light through a photomask. The exposure may be performed using, for example, a mercury i-line (365 nm) stepper. The patternwise exposed photoresist is post-exposure baked on a hot plate at 100° to 120° C. for 90 seconds, paddle-developed with a developer, and post-baked on a hot plate to remove the exposed area (the unexposed area of the photoresist remains on the peripheral light shielding layer 113).

The peripheral light shielding layer 113 is then dry etched using the remaining photoresist as a mask. Dry etching may be performed using, for example, a reactive ion etching (RIE) apparatus. An RIE apparatus may have a known plasma generation system, such as parallel plate capacitive coupled plasma-RIE or electron cyclotron resonance-RIE, and achieves dry etching using a high frequency discharge. The peripheral light shielding layer 113 is dry etched through the photoresist mask using the RIE apparatus. The area of the peripheral light shielding layer 113 corresponding to the effective pixel area where the color filters of the first to third colors are to be arrayed is thus removed as illustrated in FIGS. 22A and 22B.

In the invention, the substep of dry etching the peripheral light shielding layer 113 includes dry etching treatment for recess formation followed by dry etching treatment for residue removal.

In order to etch the peripheral light shielding layer 113 to form a recess with a rectangular cross section, a gas mixture containing at least one fluorogas and $O_2$ gas is preferably used as a first etchant gas. In carrying out the dry etching treatment for recess formation, the first etchant gas is introduced into an etching chamber in which a semiconductor substrate is placed on a flat electrode (cathode), and a high frequency voltage is applied between the flat electrode and the counter electrode, whereupon the peripheral light shielding layer 113 is anisotropically etched by the cathode effect. The fluorogas used in the dry etching treatment for recess formation is preferably a fluorine-containing compound gas represented by $C_nH_mF_1$ (where n is 1 to 6; m is 0 to 13; and 1 is 1 to 14).

Examples of the fluorogas $C_nH_mF_1$ include $CF_4$, $C_2F_6$, $C_3F_8$, $C_2F_4$, $C_4F_6$, $C_4F_6$, $C_5F_8$, and $CHF_3$. The fluorogas for use in the invention may be one or more selected from the examples above. From the viewpoint of maintaining the cross-sectional rectangularity of the etched part (i.e., the recess) of the peripheral light shielding layer, the fluorogas is preferably at least one of $CF_4$, $C_4F_6$, $C_4F_8$, and $CHF_3$, more preferably at least one of $CF_4$ and $C_4F_6$, and even more preferably a mixture of $CF_4$ and $C_4F_6$.

To maintain stability of the etching plasma and the verticality of the etched wall, it is preferred that the gas mixture used in the dry etching treatment for recess formation further contain, in addition to the fluorogas and $O_2$ gas, at least one member selected from the group consisting of rare gases (e.g., He, Ne, Ar, Kr, and Xe), gases containing halogen atom, such as Cl, F, or Br (e.g., $CCl_4$, $CClF_3$, $AlF_3$, and $AlCl_3$), $N_2$, CO, and $CO_2$. It is more preferred for the gas mixture to contain at least one of Ar, He, Kr, $N_2$, and Xe. It is even more preferred for the gas mixture to contain at least one of He, Ar, and Xe. As long as the stability of the etching plasma and the verticality of the etched wall, the gas mixture for use in dry etching treatment for recess formation may consist solely of a fluorogas and $O_2$ gas.

In dry etching treatment for residue removal, dry etching is conducted using a second etchant gas containing $O_2$ gas to remove the affected portion of the photoresist and the etching residue from the light shielding layer while retaining the cross-sectional rectangularity of the peripheral light shielding layer 113.

The second etchant gas for use in the dry etching treatment for residue removal preferably contains, in addition to $O_2$ gas, at least one of He, Ne, Ar, Kr, Xe, and $N_2$ as a third etchant gas in terms of stability of the etching plasma. The mixing ratio of the third etchant gas to $O_2$ gas, e.g., $Ar/O_2$ is preferably 40/1 or less, more preferably 20/1 or less, even more preferably 10/1 or less. The second etchant gas may further contain not more than 5% of a fluorine-containing compound gas to have improved capability of residue removal.

The third etchant gas is preferably at least one of He, Ar, and Xe. The second etchant gas may consist solely of $O_2$ gas when it is capable, by itself, of maintaining the stability of the etching plasma.

The dry etching treatment for residue removal is preferably ended in a calculated time period. For example, the dry etching time for residue removal is preferably 3 to 10 seconds, more preferably 4 to 8 seconds, in terms of maintaining the cross-sectional rectangularity of the peripheral light shielding layer 113.

The etching treatment is followed by photoresist removal. The photoresist removal is carried out by (1) a photoresist stripping treatment using a solvent or a stripper to remove the photoresist remaining on the peripheral light shielding layer 113 or (2) extending the time of the aforementioned dry etching for residue removal.

The photoresist removal may be followed by baking to remove any solvent or water. In that way, the part of the light shielding layer corresponding to where color filters are to be formed, namely the effective pixel area, is etched out, and the remaining photoresist is stripped off.

The substep of photoresist removal in the invention preferably includes the substeps of (1) applying a stripper or a solvent to the photoresist to render the photoresist ready to be removed and (2) washing off the photoresist with washing water. The substep (1) may be carried out by what we call paddle development in which a stripper or a solvent is applied to at least the photoresist and kept there for a prescribed period of time. The time for keeping the stripper or solvent on the photoresist is not particularly limited but preferably from several tens of seconds to several minutes.

The substep (2) may be carried out by spraying washing water from a spray nozzle or a shower nozzle to the photoresist to remove the photoresist. The washing water is preferably pure water. The spray nozzle may be a nozzle with a wide spray range covering the entire area of the substrate or a nozzle movable over a range covering the entire area of the substrate. In the case of using the movable spray nozzle, the photoresist is removed effectively by moving the nozzle from the center to each end of the substrate at least twice while spraying washing water to the photoresist.

The stripper generally contains an organic solvent and may further contain an inorganic solvent. Examples of useful organic solvents include hydrocarbons, halogenated hydrocarbons, alcohols, ethers, acetals, ketones, aldehydes, esters, polyhydric alcohols, carboxylic acids or anhydrides thereof, phenol compounds, nitrogen-containing compounds, sulfur-containing compounds, and fluorine-containing compounds. The stripper containing a nitrogen-containing compound is preferred. The stripper containing an acyclic nitrogen-containing compound and a cyclic nitrogen-containing compound is more preferred.

More specifically, the stripper preferably contains at least one acyclic nitrogen-containing compound selected from monoethanolamine, diethanolamine, and triethanolamine and at least one cyclic nitrogen-containing compound selected from N-methyl-1-pyrrolidone and N-ethylmorpholine. More preferably, the stripper contains monoethanolamine and N-methyl-2-pyrrolidone. The stripper preferably has an acyclic nitrogen-containing compound content of 9 to 11 parts by mass and a cyclic nitrogen-containing compound content of 65 to 70 parts by mass, each per 100 parts by mass of the stripper. The stripper for use in the invention is preferably prepared by diluting a mixture of the acyclic and the cyclic nitrogen-containing compounds with pure water.

It is only necessary that the photoresist be removed from on top of the colored, light-shielding layer 113. In other words, it is acceptable that an etching byproduct remains adhering to the etched wall of the light shielding layer. The substep of photoresist removal is preferably followed by post baking for water removal.

Figure 24:
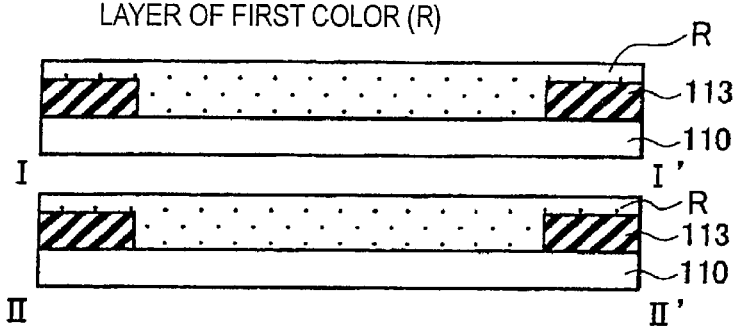
FIG. 24 illustrates a color filter layer of a first color formed.
Figure 25:
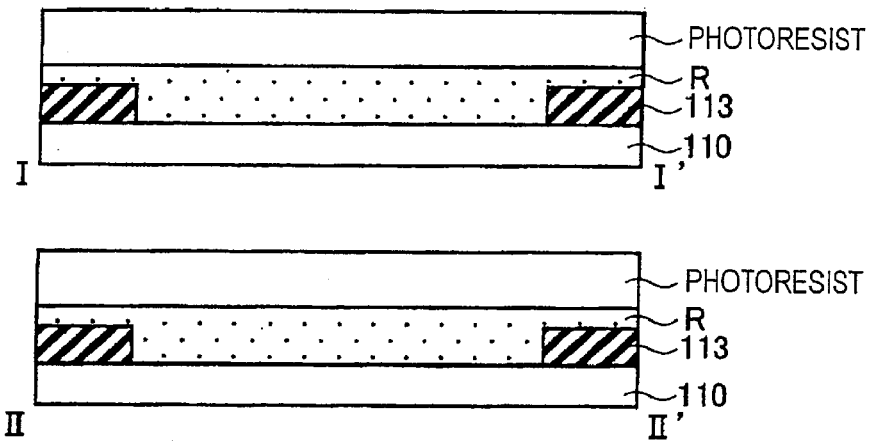
FIG. 25 illustrates a photoresist formed on the color filter layer of a first color.

The photoresist removal is followed by the substep of forming a color filter layer of a first color. The step of forming a color filter layer of a first color will be described with reference to FIGS. 24 through 28. FIG. 24 illustrates a formed color filter layer of a first color. FIG. 25 illustrates a photoresist formed on the color filter layer of a first color. FIG. 26A and FIG. 26B each illustrate the state after the photoresist is patternwise exposed to light and developed. FIG. 27A and FIG. 27B each illustrate the state after dry etching of the color filter layer of a first color. FIG. 28A and FIG. 28B each illustrate the color filters of a first color after removal of the photoresist.

As illustrated in FIG. 24, a composition providing a color filter layer of a first color is applied to fill the recess and to totally cover the peripheral light shielding layer 113 and post-baked using a hot plate to form a color filter layer of a first color.

Considering that planarization by, for example, polishing is to be performed later, the color filter layer of a first color is formed with its top surface above the top surface of the peripheral light shielding layer 113 that is to serve as a polish stop layer. In the case when the color filter layer of a first color is utilized as a polish stop layer in the planarization of the color filter layers of the first, second, and third colors, the colored composition providing the color filter layer of a first color may contain inorganic particles, e.g., of aluminum oxide, silicon oxide, or zirconium oxide, to provide polish resistance.

A positive photoresist is then applied to the entire area of the color filter layer of a first color as illustrated in FIG. 25 and prebaked to form a photoresist.

The photoresist is patternwise exposed using an i-line stepper and developed to provide a pattern for forming color filters of a second color as illustrated in FIGS. 26A and 26B. The patternwise exposure, the development, and like procedures are the same as those described above.

As illustrated in FIGS. 27A and 27B, the color filter layer of a first color is etched through a mask of the photoresist to remove the portion where color filters of a second color are to be formed. In order to form cross-sectionally rectangular recesses for color filters of a second color in the color filter layer of a first color, this etching preferably includes a dry etching treatment for recess formation using a first etchant gas containing a fluorogas and $O_2$ gas and a subsequent dry etching treatment for residue removal using a second etchant gas in the same manner as stated above.

The etching is followed by removal of the photoresist. Removal of the photoresist is carried out in the same manner with respect to the method, the solvent or stripper, and the conditions as described above.

Figure 29:
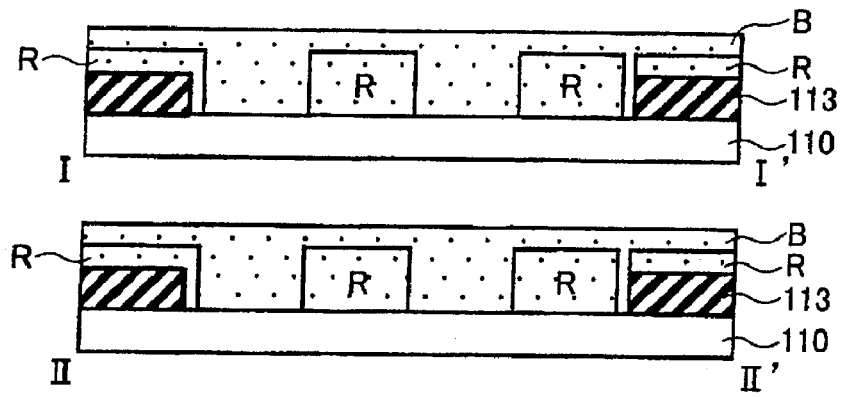
FIG. 29 illustrates a color filter layer of a second color formed.
Figure 30:
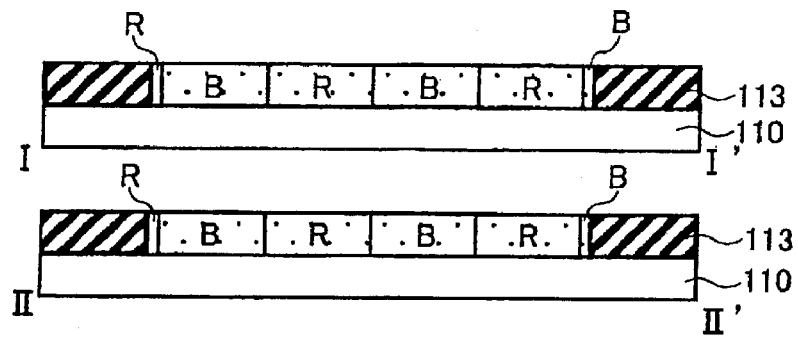
FIG. 30 illustrates color filters of a first color and a second color coplanar with each other.

The step of forming color filters of a second color will be described by referring to FIGS. 29 to 30, of which FIG. 29 illustrates a color filter layer of a second color formed, and FIG. 30 illustrates color filters of a first color and color filters of a second color cop lanar with each other.

In the step of forming color filters of a second color, a color filter layer of a second color is formed to fill the recesses and to totally cover the peripheral light shielding layer, which serves as a polish stop layer, and the color filter layer of a first color as illustrated in FIG. 29. Similarly to the formation of the color filter layer of a first color, a colored composition providing a color filter layer of a second color is applied and post-baked using a hot plate to form a color filter layer of a second color. In the case when the color filter layer of a second color is utilized as a polish stop layer, the colored composition providing the color filter layer of a second color may contain inorganic particles, e.g., of aluminum oxide, silicon oxide, or zirconium oxide to exhibit improved polish resistance.

In the following substep of planarization, the color filter layer of a second color and the color filters of a first color are polished to be coplanarized until the peripheral light shielding layer 113 as a polish stop layer is exposed. Upon exposure of the peripheral light shielding layer 113 having higher polish resistance than the color filter layers of a first and a second color, the polishing rate of the color filter layers of a first and a second color slows down. This helps coplanarize the top surface of the color filters of a first and a second color with the top surface of the peripheral light shielding layer 113, which is the end point of the polishing.

A slurry containing silicon oxide particles is used as a polishing medium. A polishing device having a polishing cloth is used under conditions of a slurry flow rate of 100 to 250 $cm^3 \cdot min^{-1}$, a wafer pressure of 0.2 to 5.0 psi, and a retainer ring pressure of 1.0 to 2.5 psi. By controlling the relative rotation speeds of the wafer and the polishing cloth within about 30 to 100 rpm, color filters with minimized micro scratches are formed. After completion of the polishing, the color filters are cleaned with pure water and post baked to remove residual water.

Figure 31:
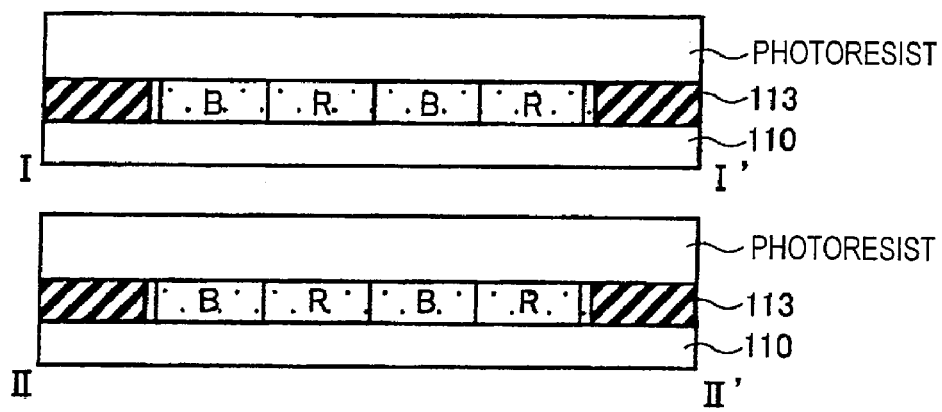
FIG. 31 illustrates a photoresist formed on the color filters of a first color and a second color.
Figure 32:
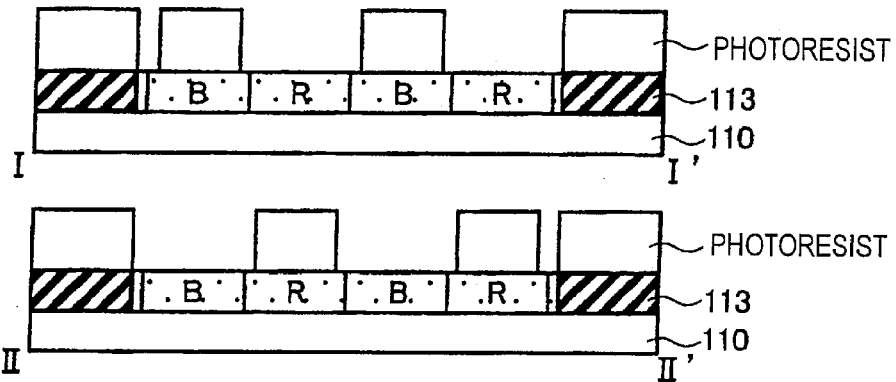
FIG. 32 illustrates the state after the photoresist is patternwise exposed to light, developed, and post-baked.
Figure 33A:
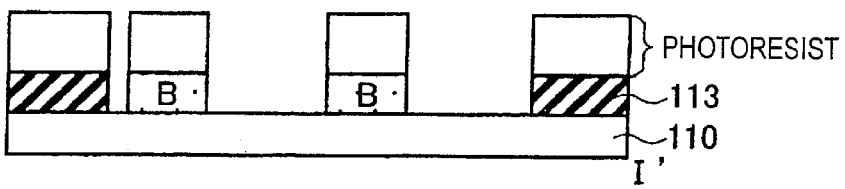
FIG. 33A and FIG. 33B each illustrate the state after dry etching the color filters using the photoresist as a mask.
Figure 33B:
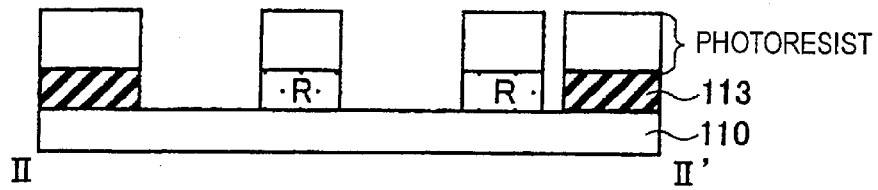
Figure 34A:
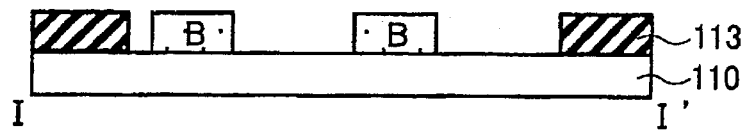
FIG. 34A and FIG. 34B each illustrate the state after removal of the photoresist.
Figure 34B:
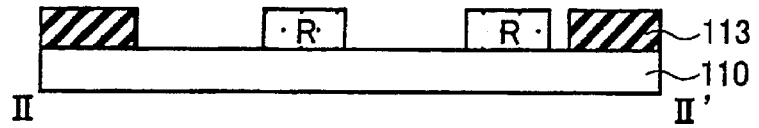

The step of forming partition walls will be described with reference to FIGS. 31 through 36. FIG. 31 illustrates a photoresist formed on the color filters of a first color and a second color. FIG. 32 illustrates the state after the photoresist is patternwise exposed to light and developed. FIG. 33A and FIG. 33B each illustrate the state after dry etching the color filters using the photoresist as a mask. FIG. 34A and FIG. 34B each illustrate the state after removal of the photoresist. FIG. 35A and FIG. 35B each illustrate a partition wall material layer formed. FIG. 36A and FIG. 36B each illustrate the color filters of a first and a second color and the partition wall material layer coplanarized with each other. The step of forming partition walls starts with formation of a photoresist as illustrated in FIG. 31. The photoresist is formed by applying a positive photoresist material on the entire area of the color filters of a first and a second color and the peripheral light shielding layer 113, followed by prebaking.

As shown in FIG. 32, the part of the photoresist corresponding to where recesses are to be made is removed by patternwise exposure using an i-line stepper. The patterning of the photoresist may be carried out in the same manner as described supra.

As illustrated in FIGS. 33A and 33B, the part of the color filter layers corresponding to where recesses are to be made is removed by etching through the photoresist as a mask. The etching is carried out by dry etching treatment for recess formation followed by dry etching treatment for residue removal in the same manner as described supra.

After the etching, the photoresist is removed as illustrated in FIGS. 34A and 34B. Removal of the photoresist is carried out in the same manner with respect to the method and conditions, the solvent or stripper, and the like as described above. The photoresist removal is followed by the formation of partition walls.

As illustrated in FIGS. 35A and 35B, a partition wall-forming composition is applied to fill the recesses and to totally cover the peripheral light shielding layer, which serves as a polish stop layer, and the color filters of a first color and a second color in the same manner as for the formation of the color filters of a first color. The applied composition is post baked using a hot plate to form a partition wall material layer 112.

The partition wall material is preferably a transparent material having a smaller refractive index than the color filters of a first, a second, and a third color, more preferably a refractive index of smaller than 1.5, even more preferably smaller than 1.4. Examples of suitable materials include a porous film, e.g., of silicon oxide, a siloxane polymer, and an amorphous fluororesin, which are commercially available, such as under the trade names of Opstar JN series (a series of low refractive index materials, available from JSR Corp.), NR series (from Toray Industries, Inc.), Cytop series (from Asahi Glass Co., Ltd.), and Teflon AF grade (from E.I. du Pont). In the case when the partition walls 112 are utilized as a polish stop layer, the partition wall-forming composition may contain inorganic particles, e.g., of aluminum oxide, silicon oxide, or zirconium oxide to exhibit improved polish resistance.

Prior to the step of forming color filters of a third color, the color filters of a first and a second color and the partition walls 112 are coplanarized by polishing until the peripheral light shielding layer 113 is exposed as illustrated in FIGS. 36A and 36B. The coplanarization may be omitted, in which case copolanarization by polishing is carried out in the step of forming color filters of a third color. The step of forming partition walls is followed by the step of forming color filters of a third color.

The step of forming color filters of a third color will be described by referring to FIGS. 37 to 41, of which FIG. 37A and FIG. 37B each illustrate a photoresist formed on the color filter layers of a first and a second color and the partition walls 112, FIG. 38 illustrates the state after the photoresist is patternwise exposed to light and developed. FIG. 39 illustrates the state after part of the partition walls is etched out to provide recesses for color filters of a third color, FIG. 40A and FIG. 40B each illustrate the state after removal of the photoresist, and FIG. 41A and FIG. 41B each illustrate a color filter layer of a third color formed. The step of forming color filters of a third color starts with applying and prebaking a positive photoresist to form a photoresist on the entire area of the partition wall material layer as illustrated in FIG. 37.

As illustrated in FIG. 38, the part of the photoresist corresponding to where color filters of a third color are to be formed is removed by patterning using an i-line stepper in the same manner as described previously.

As illustrated in FIG. 39, the part of the partition wall material layer corresponding to where color filters of a third color are to be formed is etched out to form recesses using the photoresist as a mask. The etching is carried out by dry etching treatment for recess formation, followed by dry etching treatment for residue removal in the same manner as described supra. The size of the recesses to be made in the preceding substep of photoresist patterning and this substep of etching is decided so as to form partition walls 112 of a desired width by adjusting the photoresist treating conditions and/or the dry etching conditions. In order to obtain a large pixel aperture ratio, when the pixel size is, for example, 1.0 µm, the width of the partition walls 112 is preferably 0.1 µm or smaller, and the size of the recess is preferably 0.9 µm or larger and smaller than 1.0 µm.

After the etching, the photoresist is removed as shown in FIGS. 40A and 40B. Photoresist removal is carried out in the same manner with respect to the method and conditions, the solvent or stripper, and the like as described above.

Figure 41A:
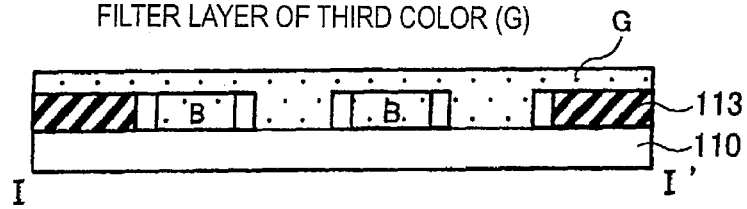
FIG. 41A and FIG. 41B each illustrate a color filter layer of a third color formed.
Figure 41B:
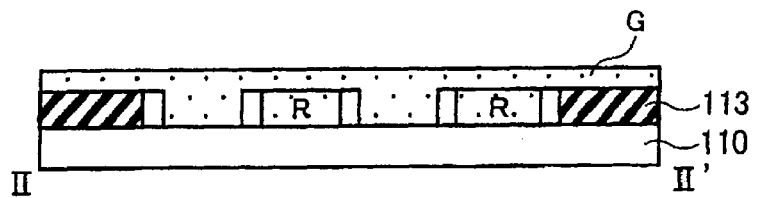

After the photoresist is removed, a color filter layer of a third color is formed to fill the recesses and totally cover the color filters of a first and a second color and the partition walls 112 as illustrated in FIGS. 41A and 41B. Similarly to the formation of the color filter layers of a first and a second color, the color filter layer of a third color is formed by applying a colored composition and post baking the applied composition using a hot plate.

The formation of the color filter layer of a third color is followed by planarization.

The planarization is carried out by CMP. The color filter layer of a third color is polished until the top surfaces of the peripheral light shielding layer 113 as a polish stop layer, the color filters of a first color, the color filters of a second color, and the partition walls 112 are exposed. Polishing until the peripheral light shielding layer 113 having higher polish resistance than the color filter layer of a third color is exposed makes it easy to coplanarize the top surface of the color filters of a third color with the top surface of the peripheral light shielding layer 113, the end point of the polishing. Thus, color filters of different colors are arrayed in the effective pixel area, being isolated from each other by the partition walls 122 made of a low refractive index material as illustrated in FIG. 18, and with their top surfaces coplanar with the top surface of the peripheral light shielding layer 113 as a polish stop layer.

When red color filters (R), green color filters (G), and blue color filters (B) are formed in a Bayer array of FIG. 17, with partition walls 112 disposed between adjacent color filters, it is preferred, in terms of production cost, that red color filters and blue color filters be formed first, the partition walls be then formed, and green color filters be finally formed, like the above illustrated example. This is because the recesses (I) formed in the etching step before the formation of the partition wall material layer (see FIG. 33) and the recesses (II) formed in the etching step before the formation of the green color filter layer (see FIG. 39) have their center of gravity at the same position and are different only in size by two widths of the partition wall 112 in a plan view. For example, when in forming pixels with a size of 1.0 µm and partition walls with a width of 0.1 µm, the recesses (I) and (II) are formed at the same center of gravity with a size of 1.1 µm and 0.9 µm, respectively, then the width of the partition wall is 0.1 µm. If partition walls are formed after all the color filters are formed, formation of 0.1 µm wide recesses would need a high resolution patterning technique and an accompanying increase of fabrication cost. According to the aforementioned example of fabrication, in contrast, since the smallest recess size is 0.9 µm, general-purpose lithographic techniques may be applied to keep costs low. Additionally, since the recesses (I) and (II) have the same shape and gravity center position, the step of forming a photoresist pattern before the formation of the recesses (I) and the step of forming a photoresist pattern before the formation of the recesses (II) may be performed by using a common photomask for exposure while changing only the recess size through controls of exposure conditions, development conditions, and etching conditions. That is, the cost of the expensive photomask can be saved.

While in the above description the planarization of color filter layers is carried out by CMP, the planarization may be otherwise conducted by, for instance, an etch-back technique (entire surface etching) in the same manner as for the above described dry etching treatment.

When patterning a color filter layer is conducted by dry etching as described, the colored compositions used to make color filters do not need to contain a photo curing component. A colored composition containing a reduced amount of a photo curing component or, preferably, no photo curing component is allowed to have an increased colorant concentration, which allows forming a color filter layer with a smaller thickness than has been possible in the conventional art while maintaining the transmission spectrum. Accordingly, the colored composition is preferably a photo-insensitive curing composition free of a photo curing component, more preferably a thermosetting composition.

The thermosetting composition for use in the invention contains a colorant and a thermosetting compound. The colorant concentration is preferably 50% or more and less than 100% by mass based on the total solids content. A higher colorant concentration allows for formation of a thinner color filter layer.

The colorant is not particularly limited. One or a mixture of two or more of known dyes and pigments may be used.

Various known organic or inorganic pigments are useful. Considering that the pigment, either organic or inorganic, should have a high transmission, it is preferred to use a pigment with as small an average particle size as possible. With handling properties also taken into consideration, the average particle size of the pigment is preferably 0.01 to 0.1 µm, more preferably 0.01 to 0.05 µm.

Examples of preferred pigments include, but are not limited to, C.I. Pigment Yellow 11, 24, 108, 109, 110, 138, 139, 150, 151, 154, 167, 180, and 185; C.I. Pigment Orange 36 and 71; C.I. Pigment Red 122, 150, 171, 175, 177, 209, 224, 242, 254, 255, and 264; C.I. Pigment Violet 19, 23, and 32; C.I. Pigment Blue 15:1, 15:3, 15:6, 16, 22, 60, and 66; and C.I. Pigment Green 7, 36, and 58.

When in using a dye as a colorant, the dye is uniformly dissolved to give a photo-insensitive, thermosetting colored composition.

Any dye known for color filter use may be used. Examples of chemical structures of useful dyes include pyrazole azo, anilino azo, triphenylmethane, anthraquinone, anthrapyridone, benzylidene, oxonol, pyrazolotriazole azo, pyridone azo, cyanine, phenothiazine, pyrrolopyrazole azomethine, xanthene, phthalocyanine, benzopyran, and indigo.

The colorant content relative to the total solids content of the colored thermosetting composition is preferably, but not limited to, 30% to 60% by mass. A colorant content of 30% or more secures suitable chromaticity as a color filter. With a colorant content of 60% or less, sufficient heat curing occurs to avoid reduction of film strength.

Any thermosetting compound that cures in film form on heating is useful to form color filters. For example, a compound having a thermosetting functional group may be used. A compound having at least one thermosetting functional group selected from an epoxy group, a methylol group, an alkoxymethyl group, and an acyloxymethyl group is preferred.

Examples of preferred thermosetting compounds include (a) epoxy compounds, (b) melamine compounds, guanamine compounds, glycoluryl compounds, and urea compounds each having at least one substituent selected from a methylol group, an alkoxymethyl group, and an acyloxymethyl group, and (c) phenol compounds, naphthol compounds, and hydroxyanthracene compounds each having at least one substituent selected from a methylol group, an alkoxymethyl group, and an acyloxymethyl group. Preferred among them is a polyfunctional epoxy compound.

The total content of the thermosetting compound in the colored thermosetting composition is preferably 0.1% to 50% by mass, more preferably 0.2% to 40% by mass, even more preferably 1% to 35% by mass, although varying depending on the compound.

If desired, the colored thermosetting composition may contain various additives as long as such does not affect the effects of the invention. Examples of additives include binders, curing agents, curing catalysts, solvents, fillers, polymeric compounds other than those described, surfactants, adhesion enhancer, antioxidants, UV absorbers, anti-coagulants, and dispersants.

In the cases where color filters of different colors are formed by dry etching, an etching resist pattern is formed using a photoresist as described. In the step of removal, too, a resist pattern is preferably formed using a photoresist.

The positively working photosensitive resin composition as a positive photoresist may be a positive photoresist composition sensitive to a radiation, such as UV radiation (g-line, h-line, or i-line of mercury lamps), deep UV radiation (including an excimer laser beam), an electron beam, an ion beam, and X-rays. Of the radiations described, preferred are g-line, h-line, and i-line. An i-line is particularly preferred.

Specifically, the positive photosensitive resin composition preferably contains a quinonediazide compound and an alkali soluble resin. On being irradiated with a radiation of 500 nm or shorter wavelengths, the quinonediazide group of the quinonediazide compound decomposes to produce a carboxyl group, whereby the alkali insoluble composition turns to alkali soluble. The positive photoresist of this type has remarkably high resolution and is widely used in the semiconductor fabrication. The quinonediazide compound is exemplified by a naphthoquinonediazide compound.

Any developer may be used as long as it is capable of dissolving the exposed area of a positive photoresist or the unexposed area of a negative photoresist without affecting the peripheral light shielding layer. Specifically, a combination of various solvents or an aqueous alkali solution may be used.

While the steps of forming color filters of different colors have been described with particular reference to color filters of primary color (RBG) system, these steps are also applicable to the formation of color filters of complementary color system using cyan, magenta, yellow, and green.

The protective layer 114, also called an overcoat layer, is provided on the color filters to give protection to the color filters during the subsequent steps. The protective layer may be made of an appropriate material, including polymers such as acrylic resins, polysiloxane resins, polystyrene resins, and fluororesins, and inorganic materials such as silicon oxide and silicon nitride. Using a photosensitive resin, such as a polystyrene resin, provides the following advantages. (1) The protective layer is capable of being patterned by photolithography and therefore usable as a photoresist in forming contact openings to make bonding pads through the peripheral light shielding layer 113, the sealing layer 110, the dielectric layer 102, etc. (2) The protective layer may be formed into a microlens array.

The protective layer may also serve as an antireflection layer. In that case, the protective layer may preferably be made of any of the low refractive index materials described as a partition wall forming material. To ensure the function as a protective layer in the subsequent steps or as an antireflection layer, the protective layer may be composed of two or more sublayers of different materials selected from those described above.

To further improve light collecting efficiency or to ensure prevention of color cross-talk, the protective layer may be formed into a microlens array, or a microlens array may be provided on the protective layer. While a microlens array is not provided in the configuration illustrated in FIG. 1, improvement in light collecting efficiency and prevention of color cross-talk are sufficiently achieved because the color filters are isolated from each other by low refractive index partition walls. Whether a microlens array should be formed is decided taking into consideration the cost therefor and the difficulty of optical design.

Figure 42:
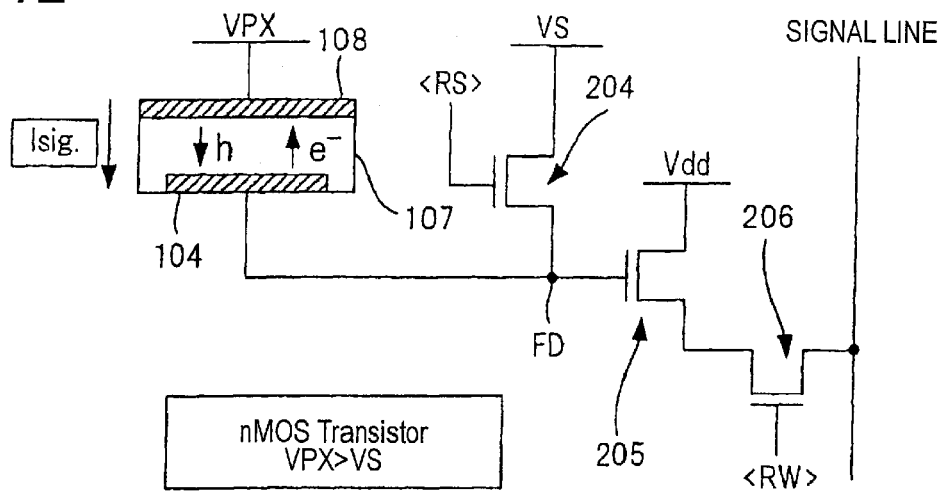
FIG. 42 illustrates a first example of a readout circuit.

FIG. 42 illustrates a first example of the readout circuits 116 used in the solid state imaging device of FIG. 1. The readout circuit of FIG. 42 includes a floating diffusion node (FD), a reset transistor 204, an output transistor 205, and a select transistor 206. The reset transistor 204, the output transistor 205, and the select transistor 206 are each of an n-channel MOS type (nMOS transistor).

The FD is electrically connected to the pixel electrode 104 and changes its potential in response to the potential of the pixel electrode 104. In the first example of FIG. 42, the voltage VPX applied to the counter electrode 108 is set so that the signal current Isig may flow from the counter electrode 108 to the pixel electrode 104 (i.e., so that positive holes may be collected by the pixel electrode 104) during exposure to light. During exposure to light, Isig flows to the pixel electrode 104 to raise the potential of the pixel electrode 104, whereby the potential of the FD rises.

The reset transistor 204 is to reset the FD to a prescribed potential. The reset transistor 204 has its drain terminal electrically connected to the FD, and a voltage VS is supplied to its source terminal When the reset pulse RS applied to the gate terminal of the reset transistor 204 is at high level, then the reset transistor 204 turns on, and electrons are injected from the source to the drain of the reset transistor 204. The electrons injected drop the potential of the FD to reset the potential to a prescribed level. The voltage VS is set lower than the voltage VPX (VPX>VS), whereby the signal current Isig flows from the counter electrode 108 to the pixel electrode 104 during exposure to light. For example, the VPX may be the power source voltage Vdd of the imaging device, and the VS may be the ground voltage GND. The Vdd is a voltage supplied from the driving power source of the CMOS image sensor.

In the above arrangement, when the amount of accumulated signal charge is small, the potential of the FD is low, while when that amount is large, the potential of the FD is high. Because the noise caused by dark current occurring at the FD is smaller as the potential of the FD is lower, the arrangement effectively reduces the dark current-induced noise at the FD to increase the SN ratio when the amount of accumulated signal charge is small, at which time noise reduction is strongly demanded to improve the SN ratio.

The output transistor 205 is to output the potential of the FD as a voltage signal. The output transistor 205 has its gate terminal electrically connected to the FD, and a power source voltage Vdd is supplied to its drain terminal. The source terminal of the output transistor 205 is connected to the drain terminal of the select transistor 206.

The select transistor 206 is to selectively output the signals from the output transistor 205 to a signal line. The select transistor 206 has its source terminal connected to the signal line. When the select pulse RW applied to the gate terminal of the select transistor 206 are at high level, the select transistor 206 turns on, and the voltage signals from the output transistor 205 are output to the signal line.

The readout circuit according to the first example illustrated above reads out the signals in response to the charges collected by the pixel electrode 104 into a signal line.

Figure 43:
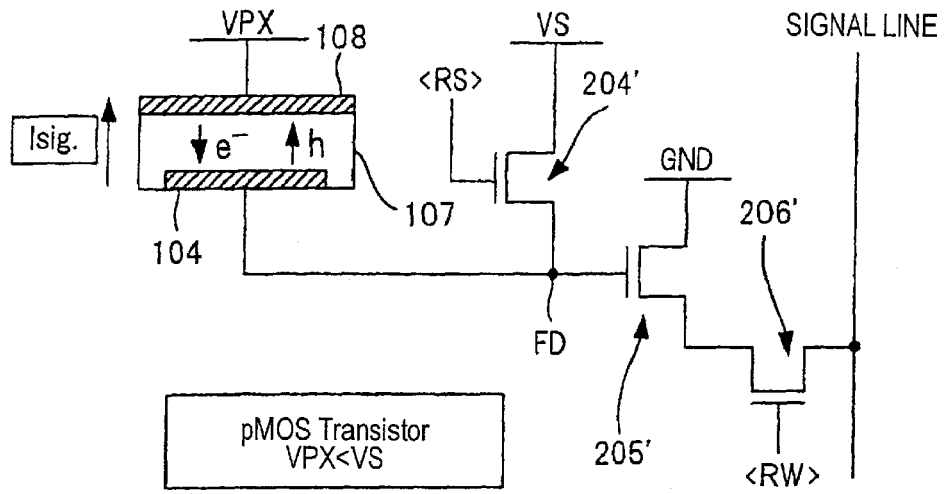
FIG. 43 illustrates a second example of a readout circuit.

FIG. 43 illustrates a second example of the readout circuits 116 used in the solid state imaging device of FIG. 1. The readout circuit of FIG. 43 has the same configuration as that of the first example shown in FIG. 42, except for replacing the reset transistor 204, the output transistor 205, and the select transistor 206 with a reset transistor 204', an output transistor 205', and a select transistor 206', respectively. The reset transistor 204', the output transistor 205', and the select transistor 206' are each of a p-channel MOS type (pMOS transistor). In the readout circuit of the second example, the voltage VPX is set lower than the voltage VS (VPX<VS), and the voltage supplied to the drain terminal of the output transistor 205' is the ground voltage GND.

According to this circuitry, when the reset pulse RS applied to the gate terminal of the reset transistor 204' becomes low, the reset transistor 204' turns on, and holes are injected from the source to the drain of the reset transistor 204'. The holes raise the potential of the FD to reset the FD to a prescribed level. Since the voltage VS is set higher than the voltage VPX, the signal current Isig flows from the pixel electrode 104 to the counter electrode 108 during exposure to light. Isig flowing from the pixel electrode 104 to the counter electrode 108, the potential of the pixel electrode 104 drops, whereby the potential of the FD also drops. The output transistor 205' converts the potential after the drop to a voltage signal, and the voltage signal is output through the select transistor 206' to a signal line.

In that way, the readout circuit may be composed of pMOS transistors.

In the circuitry arrangement of FIG. 42, the MOS circuit is composed of nMOS transistors. It could be conceivable, therefore, that VPX is set lower than VS so that electrons are collected by the pixel electrode 104, and the voltage signals in response to the amount of collected electrons are output from the output transistor 205. In that case, with the start of exposure to light, the potential of the pixel electrode 104 drops. After the end of exposure, the signals are read out, and the FD is reset to raise its potential. On completion of the reset, the potential of the FD drops slightly from the reset level. From this state, the potential of the FD is able to drop to the lowest level in response to the amount of light received. That is, because the drop of the voltage of the FD after completion of reset is not read out as a signal, the saturation charge is reduced.

In the circuit of FIG. 42, with the start of reset, the potential of the FD drops to a prescribed potential. After completion of the reset, the potential of the FD further drops from the prescribed level. From this state, the potential of the FD is able to rise to the highest level in response to the light received. That is, because the drop of the voltage of the FD after completion of reset is read out as a signal, the saturation charge is increased. As a result, the imaging device is capable of taking an image of a subject having low to high luminances with a large dynamic range. The effect on a dynamic range is also achieved by the circuit shown in FIG. 43.

In the circuit of FIG. 42, the potential of the FD increases from VS to VPX in response to the amount of light received. When VPX is higher than the power source voltage Vdd, the potential of FD increases excessively, and an excessive voltage is applied to the FD, which can cause a failure in the circuit. Then it is preferred to provide a protection so that the potential of the FD may not exceed a prescribed value (threshold). Examples of such a protection are illustrated by way of FIGS. 44 and 45.

Figure 44:
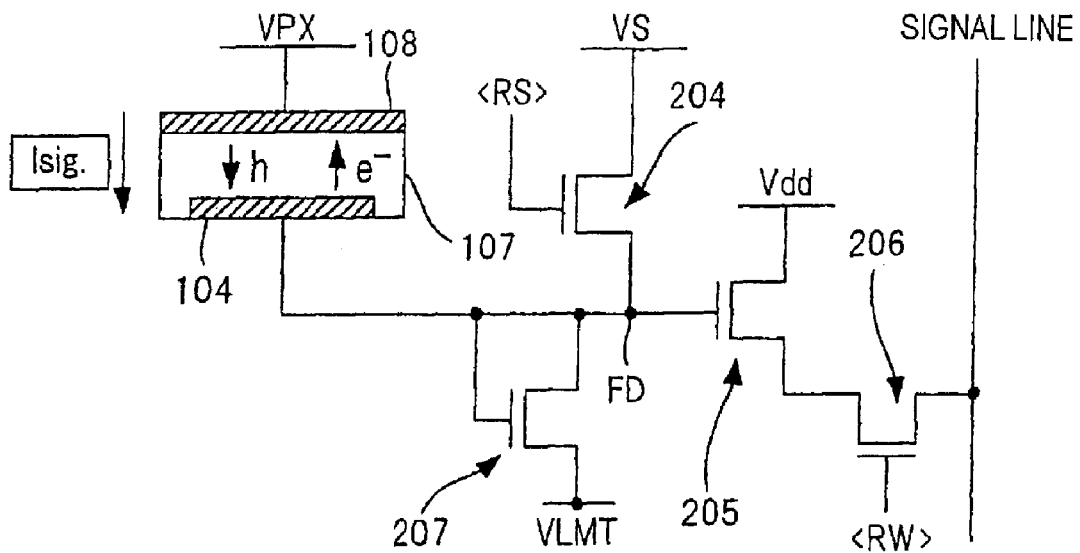
FIG. 44 illustrates the readout circuit of the first example having a transistor added as a protection.

FIG. 44 illustrates the readout circuit shown in FIG. 42 having an nMOS transistor 207 added as a protection. The transistor 207 has its gate terminal and drain terminal electrically connected to the pixel electrode 104 and the FD, respectively, and a voltage VLMT is supplied to the source terminal. The transistor 207 prevents the potential of the FD from exceeding the VLMT plus the threshold voltage Vth of the transistor 207 (VLMT+Vth).

Figure 45:
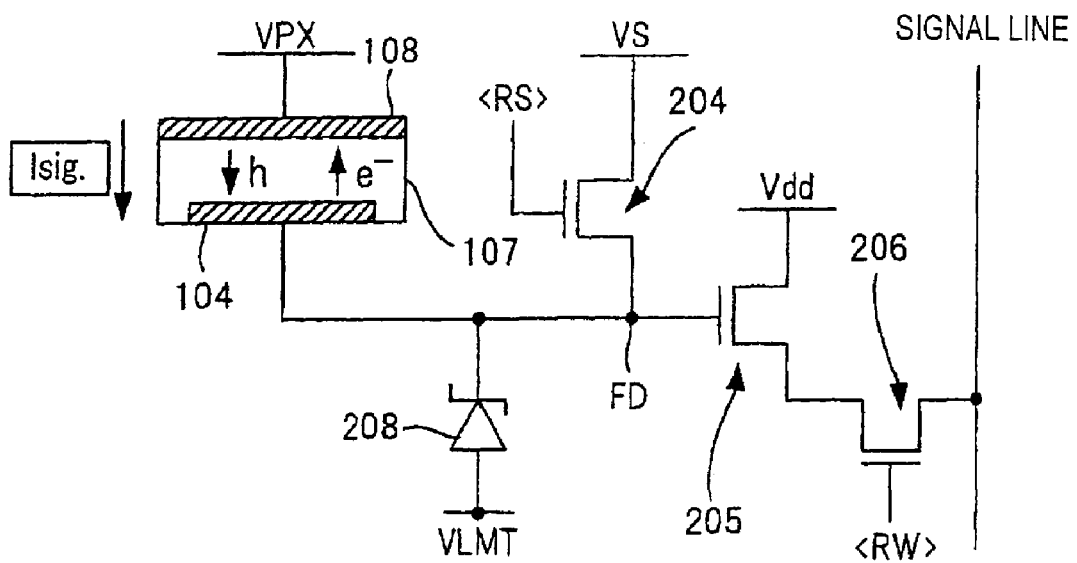
FIG. 45 illustrates the readout circuit of the first example having a diode added as a protection.

FIG. 45 illustrates the readout circuit of FIG. 42 having a diode 208 added as a protection. The diode 208 has its cathode electrically connected to the pixel electrode 104 and the FD, and a voltage VLMT is supplied to the anode. The diode 208 prevents the potential of the FD from exceeding the VLMT plus the breakdown voltage Vb of the diode 208 (VLMT+Vb).

In the circuit of FIG. 43, the potential of the FD falls from VS to VPX in response to the amount of light received. When the absolute value of the voltage (VPX-GND) becomes larger than the absolute value of the power source voltage (Vdd-GND), an excessive voltage is applied to the FD, which can cause a failure in the circuit. Then it is preferred to provide a protection so that the potential of the FD may not drop below a prescribed value (threshold). A transistor or a diode may be added as a protection in the same manner as illustrated in FIGS. 44 and 45.

Examples of the drive mode of the circuit shown in FIG. 42 are given below.

Figure 46:
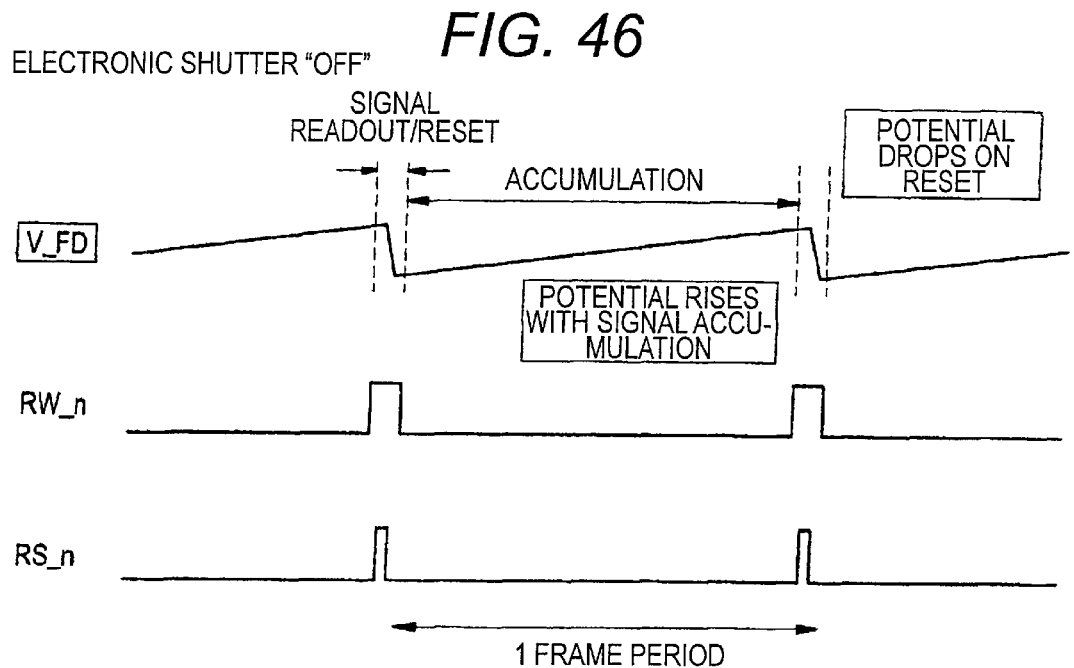
FIG. 46 represents a driving timing diagram of the readout circuit of the first example with an electronic shutter turned off.

FIG. 46 is a driving timing diagram of the readout circuit of FIG. 42 with an electronic shutter turned off. In FIG. 46, "V_FD" represents the change in potential of the FD; "RW_n" represents the change in select pulse supplied to the gate terminal of the select transistor 206 of an nth row readout circuit out of the two-dimensionally arrayed readout circuits; and "RS_n" represents the change in reset pulse supplied to the gate terminal of the reset transistor 204 of an nth row readout circuit. The select pulse and the reset pulse are supplied by the vertical driver 121 illustrated in FIG. 2.

On expiration of the exposure time during which charges are stored in the pixel electrode 104, the select pulse rises to a high level, an a signal in response to the potential of the FD is output as a data level. While the select pulse is high, the reset pulse rises to a high level, and the potential of the FD is reset to a prescribed level. When the reset pulse falls to a low level, the potential of the FD slightly varies. The potential of the FD after this variation is output to a signal line as a reset level. The signal processing circuit 123 subtracts the reset level from the data level and converts the signal after subtraction into digital form. The digital signal is output outside the imaging device under the control by the horizontal driver 124. After the reset level is read out, the select pulse drops to a low level, at which time exposure for the next frame period starts. The operation after expiration of the exposure time is the same as described.

Figure 47:
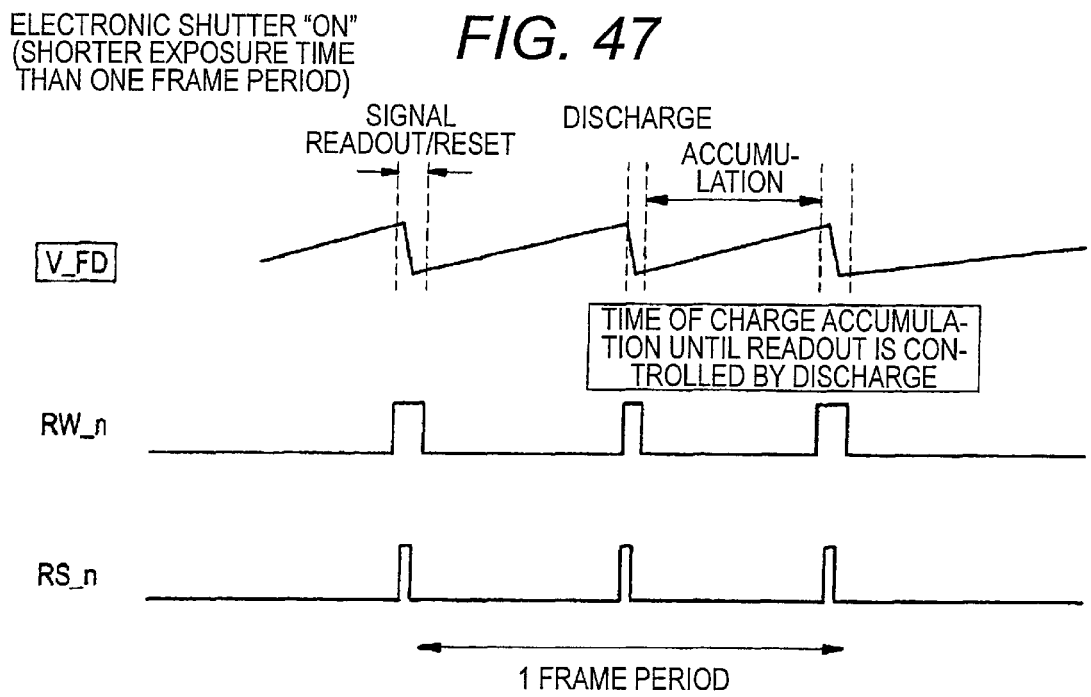

FIG. 47 is a driving timing diagram of the readout circuit illustrated in FIG. 42, with an electronic shutter on. Designations in FIG. 47 are the same as used in FIG. 46. According to the timing diagram of FIG. 47, the select pulse and the reset pulse rise to a high level to reset the potential of the FD in the middle of one frame period of the timing diagram of FIG. 46. By so doing, the period for accumulating charge in the pixel electrode 104 may be arbitrarily controlled within one frame.

Figure 48:
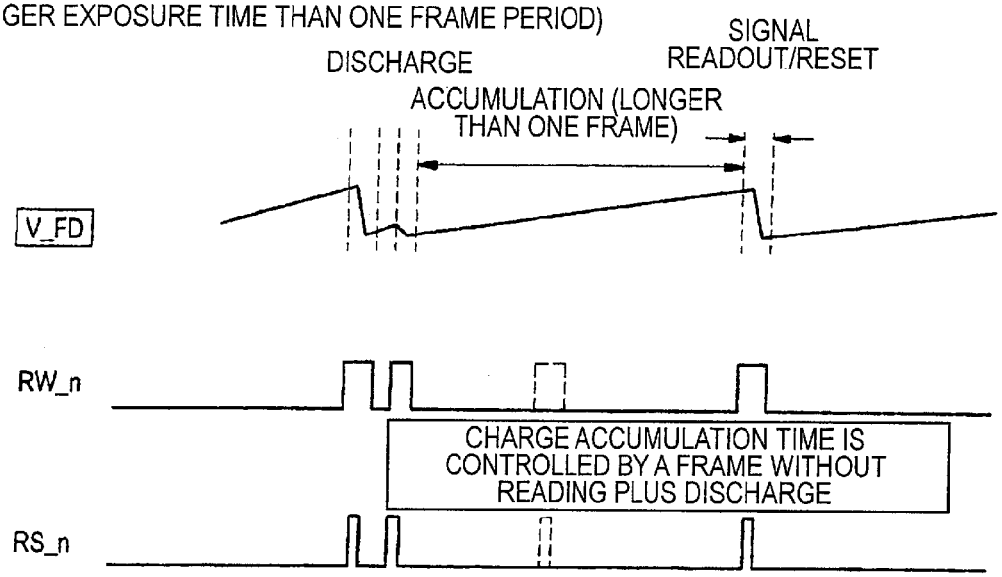

FIG. 48 is a driving timing diagram of the readout circuit illustrated in FIG. 42, with an electronic shutter function on. Designations in FIG. 48 are the same as used in FIG. 46. According to the timing diagram of FIG. 48, the select pulse and the reset pulse rise to a high level to reset the potential of the FD in the middle of two frame periods of the timing diagram of FIG. 46. By so doing, the time of accumulating charge in the pixel electrode 104 may be made longer than one frame period.

According to the drive modes of FIGS. 46 to 48, CDS processing is performed through subtraction of the reset level obtained before starting exposure for next frame from the data level obtained by the exposure of the preceding frame. Because the reset level includes kTC noise generated when the reset transistor 204 is off, it is difficult to perform accurate processing for noise reduction by this CDS processing. As an approach to reduce the kTC noise, there is a method in which a variable voltage is applied to the source terminal of the reset transistor, and the voltage is varied during the reset time. An example of the drive mode adopting the method is described by way of FIG. 49.

Figure 49:
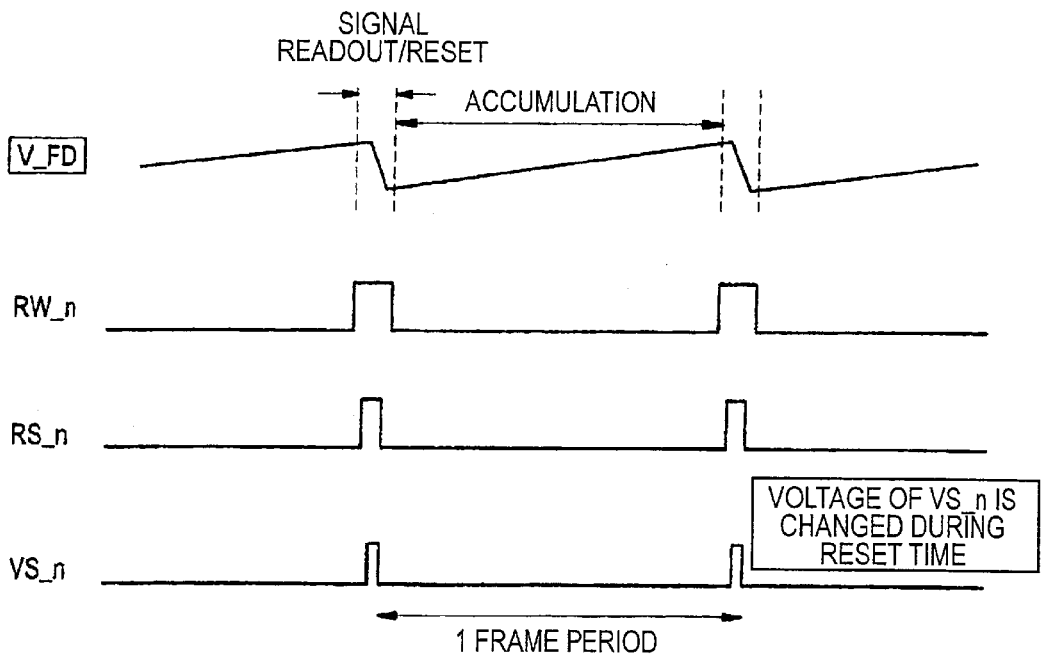
FIG. 49 represents a driving timing diagram of the readout circuit of the first example with an electronic shutter turned off, which diagram may be employed to reduce kTC noise.

FIG. 49 represents a driving timing diagram of the circuit shown in FIG. 42 with the electronic shutter function off, which is designed for kTC noise reduction. The designations in FIG. 49 are the same as used in FIG. 46. According to this drive mode, the voltage supplied to the source terminal of the rest transistor 204 is not fixed but variable. Therefore, the timing diagram additionally has a waveform of "VS_n", which shows change in the voltage VS supplied to the source terminal of the reset transistor 204 of the readout circuit in the nth row.

The difference of the timing diagram of FIG. 49 from that of FIG. 46 is that the voltage VS is increased immediately before the reset pulse falls to a low level and returned to the original level when the reset pulse falls to a low level. Such a drive mode reduces kTC noise by half compared with ordinary reset operation, thereby to achieve noise reduction. The driving mode described applies as well to the mode with the electronic shutter function on.

While the foregoing description about driving modes has been confined to the readout circuit of FIG. 42, the same applies to the circuit of FIG. 43 with the exceptions that the polarity of the reset pulse and the select pulse, the potential of the FD is reversed, and the polarity of "VS_n" are inversed.

Another method for reducing kTC noise will be described with reference to FIGS. 50 through 52.

Figure 50:
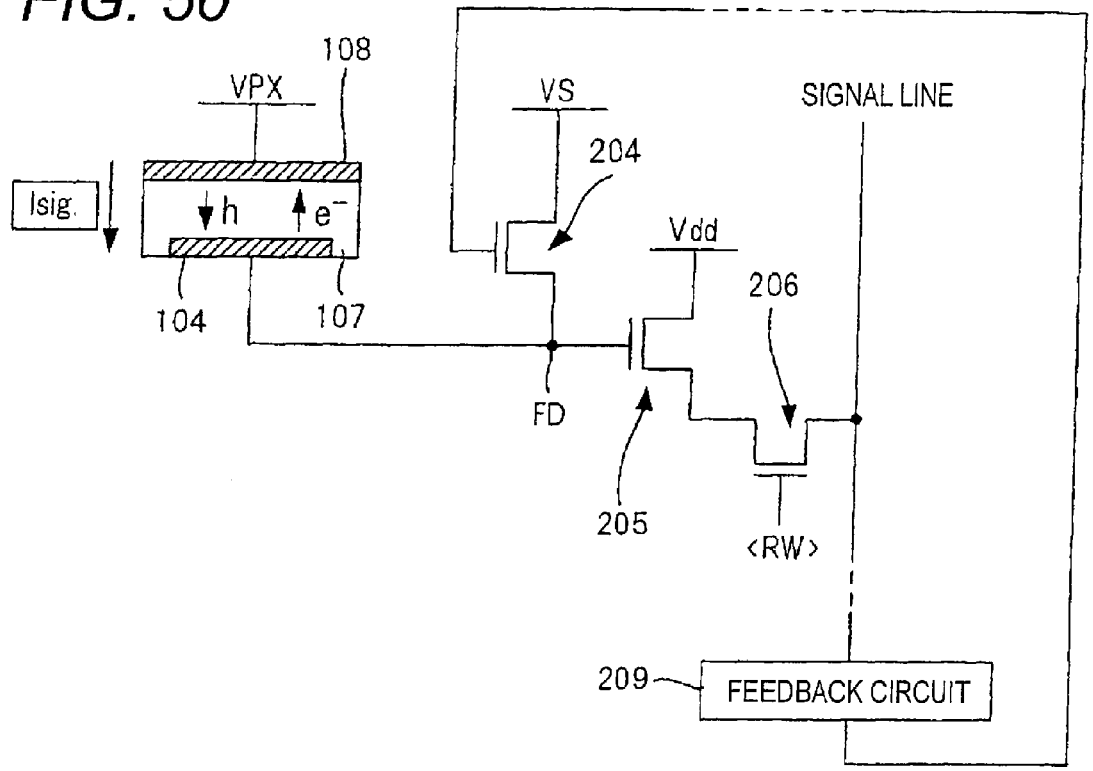
FIG. 50 is the readout circuit of the first example having a means for reducing kTC noise added.

FIG. 50 is the readout circuit of FIG. 42 having added thereto a feedback circuit 209 as a means for reducing kTC noise.

The feedback circuit 209 sends the signals output to the signal line during the high level period of the reset pulse to the gate terminal of the reset transistor 204 and outputs other signals to the signal processing circuit 123. The feedback circuit 209 includes a selector switch between the signal line and the gate terminal of the reset transistor 204. The reset transistor 204 can thus be turned off while narrowing the bandwidth of the reset transistor 204. Therefore, the reset transistor 204 can be turned off with minimized thermal fluctuations of the FD, resulting in reduction of kTC noise.

Figure 51:
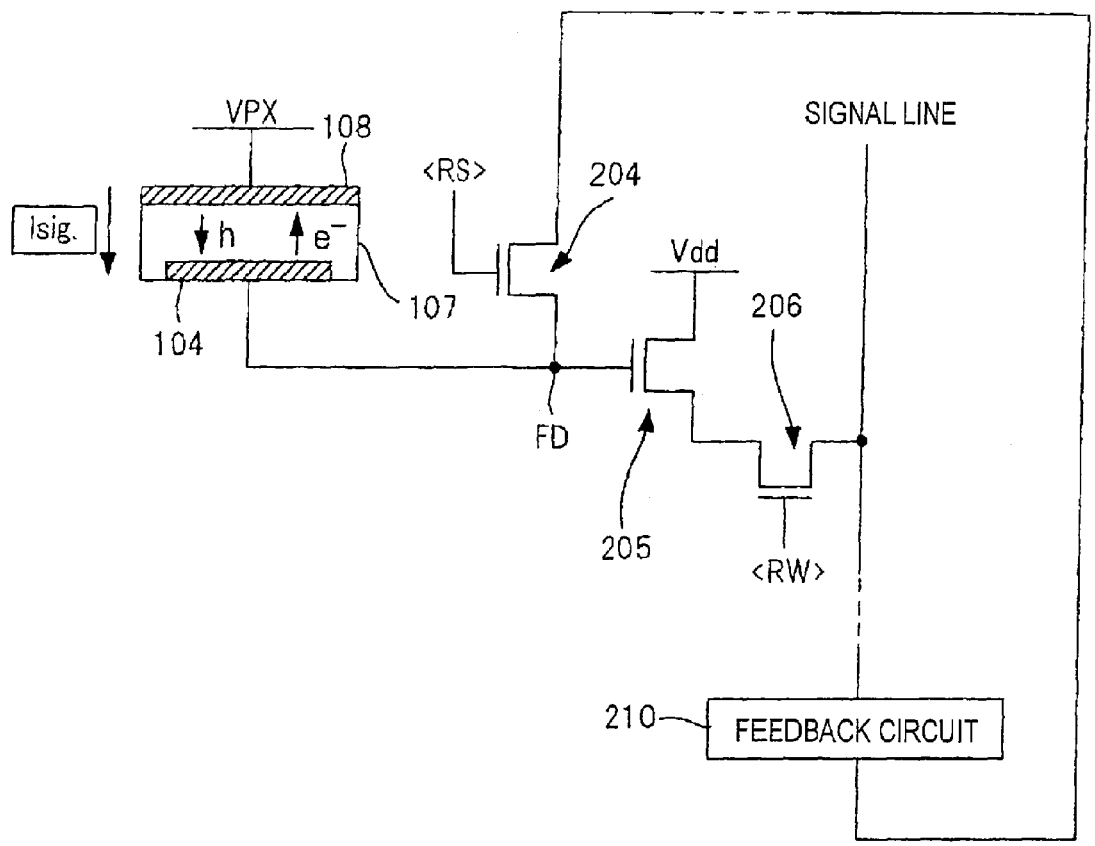
FIG. 51 is the readout circuit of the first example having another means for reducing kTC noise added.

FIG. 51 is the readout circuit of FIG. 42 having added thereto a feedback circuit 210 as a means for reducing kTC noise.

The feedback circuit 210 sends the signals output to the signal line during the high level period of the reset pulse to the source terminal of the reset transistor 204 and outputs other signals to the signal processing circuit 123. The feedback circuit 210 includes a selector switch between the signal line and the source terminal of the reset transistor 204. There is formed a feedback loop between the source terminal of the reset transistor 204 and the FD. The reset transistor 204 can thus be turned off while narrowing the bandwidth of the gate voltage. Therefore, the reset transistor 204 can be turned off while removing thermal noise by the operation of the feedback loop, resulting in reduction of kTC noise.

Figure 52:
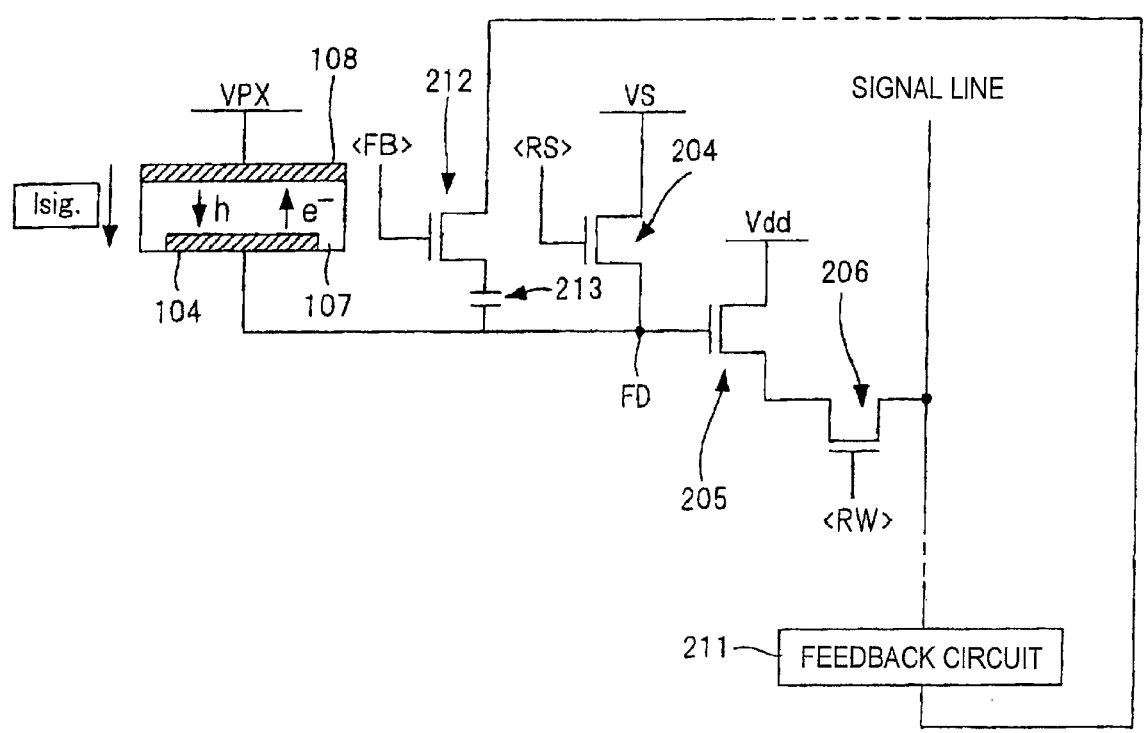
FIG. 52 is the readout circuit of the first example having still another means for reducing kTC noise added.

FIG. 52 is the readout circuit of FIG. 42 having added thereto a feedback circuit 211, an nMOS transistor 212, and a condenser 213 as a means for reducing kTC noise.

The transistor 212 has its drain terminal electrically connected to the pixel electrode 104 and the FD via the condenser 213 and its source terminal connected to the feedback circuit 211. The transistor 212 is controlled by the feedback pulse supplied to its gate terminal.

The feedback circuit 211 sends the signals output to the signal line during the high level period of the reset pulse to the source terminal of the transistor 212 and outputs other signals to the signal processing circuit 123. The feedback circuit 211 includes a selector switch between the signal line and the source terminal of the transistor 212. By maintaining the transistor 212 on during the period in which the reset pulse is high, kTC noise generating when the reset transistor 204 is turned off is removed. After the reset transistor 204 is turned off, the transistor 212 should be turned off. This turning off the transistor 212 can generate another kTC noise. However, the circuit arrangement of FIG. 52 divides the another kTC noise between the capacity of the condenser 213 and the capacity of the FD and is detected by the FD. In terms of results, kTC noise is successfully reduced.

Other examples of the structure of the solid state imaging device according to the invention are illustrated below with reference to FIGS. 53 and 54. Elements and members having equal structures or functions to those previously described are identified with the same numerals or alphabetical designations as in the foregoing description. Their description will not be repeated or will be given only briefly.

Figure 53:
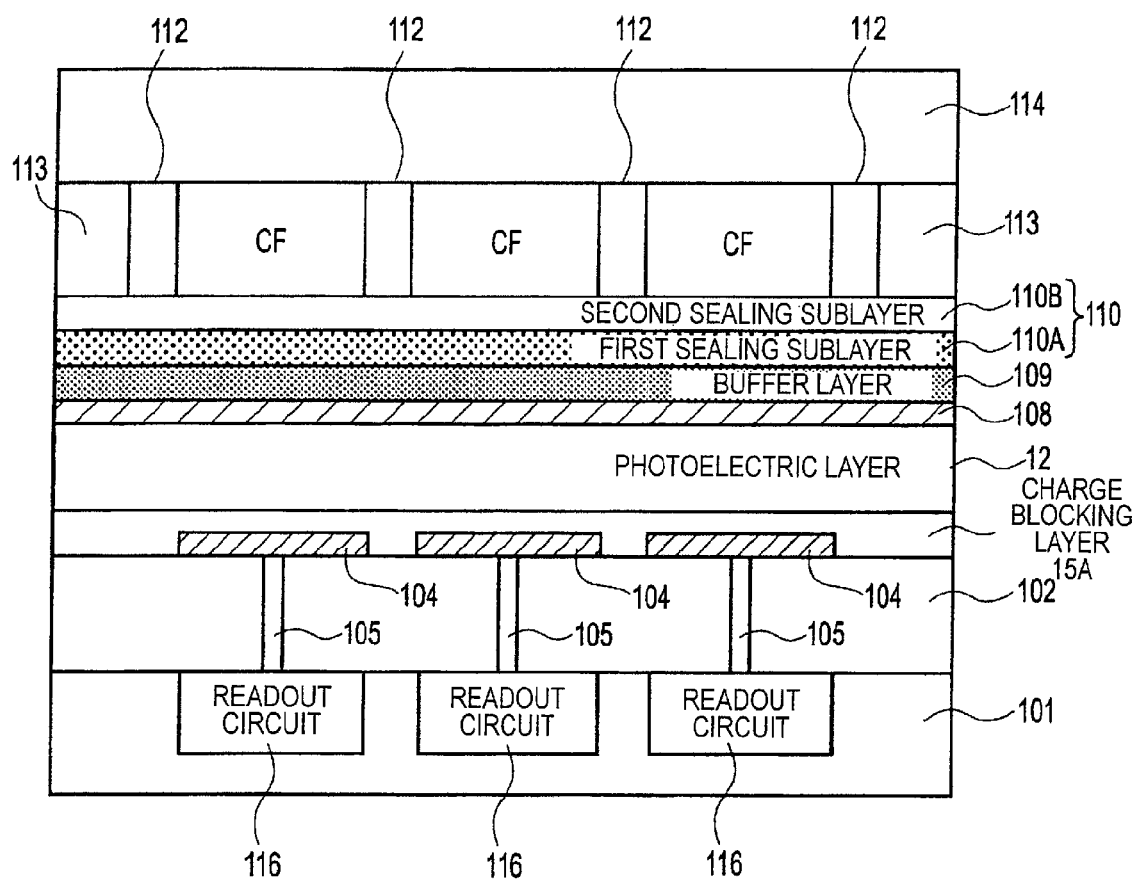
FIG. 53 is a schematic cross-section representing another example of the structure of the solid state imaging device of the invention.

FIG. 53 is a schematic cross-section representing the structure of another solid state imaging device. The solid state imaging device of FIG. 53 has pixel electrodes 104 on the surface of the dielectric layer 102 and a charge blocking layer 15a covering the dielectric layer 102 and the pixel electrodes 104. The charge blocking layer 15a functions to control injection of electrons from the pixel electrodes 104 to the photoelectric layer 12. In the configuration shown, the potential of the counter electrode 108 is set higher than the source potential of the reset transistor in the readout circuit 116 so that an electric current may flow from the counter electrode to the pixel electrodes 104, i.e., holes may be collected by the pixel electrodes 104.

The readout circuit 116 is composed of an FD, a reset transistor, an output transistor, a select transistor, and a protective transistor for limiting the FD potential as illustratively shown in FIG. 44. All these transistors are of nMOS type. The readout circuit 116 further contained the previously described feedback circuit between the reset transistor and the signal line for kTC noise reduction. The readout circuits 116, multilevel interconnects including via plugs 105, the dielectric layer 102, and the pixel electrodes 104 were fabricated using standard CMOS image sensor processes. The pixel electrodes 104 were formed by depositing TiN by CVD to a thickness of 15 nm and patterning the TiN layer by dry etching. The Ra of the pixel electrodes 104 was 0.4 nm The dry etching was carried out under isotropic plasma etching conditions so that the pixel electrodes 104 had a slope along their edges at a slope angle of 50° with respect to the substrate.

The charge blocking layer 15a was deposited by evaporation of compound 2 represented by formula (2) below to a thickness of 100 nm The photoelectric layer 12 was formed by co-depositing compound represented by formula (3) below and fullerene $C_{60}$ at a ratio of 20:80 (%) to a thickness of 400 nm The electron affinity Ea of $C_{60}$ present in the photoelectric layer is 4.2 eV. The ionization potential Ip of compound 2 in the charge blocking layer 15a is 5.2 eV. Accordingly, $\Delta 1 = 1.0$ eV. The photoelectric device having the structure described was able to control dark current effectively. The electron affinity Ea of compound 2 is 1.9 eV, and the work function of TiN (pixel electrodes 104) is 4.5 eV. Accordingly, $\Delta 2 = 2.6$ eV. Injection of electrons from the pixel electrodes 104 to the photoelectric layer 12 was thus prevented. These deposition steps were carried out at a degree of vacuum of $1 \times 10^{-4}$ Pa or less. The photoelectric layer 12 and the charge blocking layer 15a were deposited in the first region indicated in FIG. 1 by placing a first metal mask on the substrate. The work function and the Ip of each layer were determined using a photoelectron spectrometer in air (AC-2, from Riken Keiko Co., Ltd.). The electron affinity Ea of each layer was obtained by subtracting Eg from Ip of the material (Ea=Ip−Eg), wherein Eg is an energy at the spectral absorption end of the layer.

Formula (2):

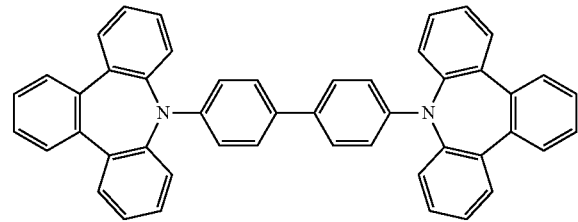

Formula (3):

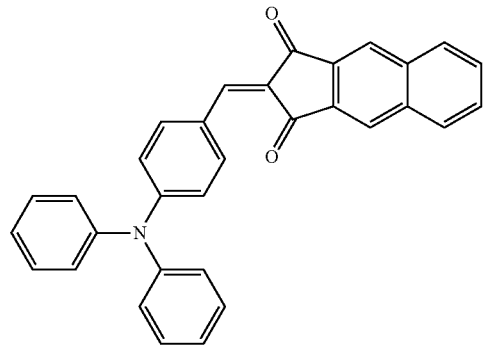

The counter electrode 108 was deposited in the second region indicated in FIG. 1 using a second metal mask placed above the substrate. The counter electrode 108 was formed of ITO in a high frequency magnetron sputter system using ITO as a target at a degree of vacuum of 0.1 Pa in an $Ar/O_2$ gas atmosphere to a thickness of 10 nm.

The buffer layer 109 was formed by vacuum evaporation of silicon monoxide to a deposit thickness of 100 nm The buffer layer 109 was provided in the third region indicated in FIG. 1 by placing a third metal mask above the substrate. The deposition was carried out at a degree of vacuum of $1 \times 10^{-4}$ Pa or less.

The deposition of the charge blocking layer 15a, the photoelectric layer 12, the counter electrode 108, and the buffer layer 109 was achieved by use of an apparatus for fabricating an organic EL device in which vacuum evaporation units and a sputtering unit are connected to a cluster vacuum transfer system having a degree of vacuum of $1 \times 10^{-4}$ Pa or less.

The first sealing sublayer 110A was formed of aluminum oxide by ALD using trimethylaluminum and water as precursors and Ar as a carrier gas. The ALD was carried out at a degree of vacuum of 0.5 kPa and at a substrate temperature of 150° C. or lower to a deposit thickness of 0.2 µm.

A 0.1 µm thick silicon nitride film was provided on the first sealing sublayer 110A as the second sealing sublayer 110B serving as an auxiliary sealing sublayer. The second sealing sublayer 110B was deposited by high frequency magnetron sputtering using a silicon nitride target at a degree of vacuum of 0.1 Pa in an $Ar/N_2$ atmosphere.

The color filters CF, the partition walls 112, the protective layer (overcoat layer) 114 are formed in the same manner as described above.

The solid state imaging device of the invention has a partition wall 112 between adjacent color filters CF of adjacent pixels. Because the material of the partition wall 112 is transparent and has a lower refractive index than the material of the color filters, color cross-talk between adjacent pixels is prevented.

Figure 54:
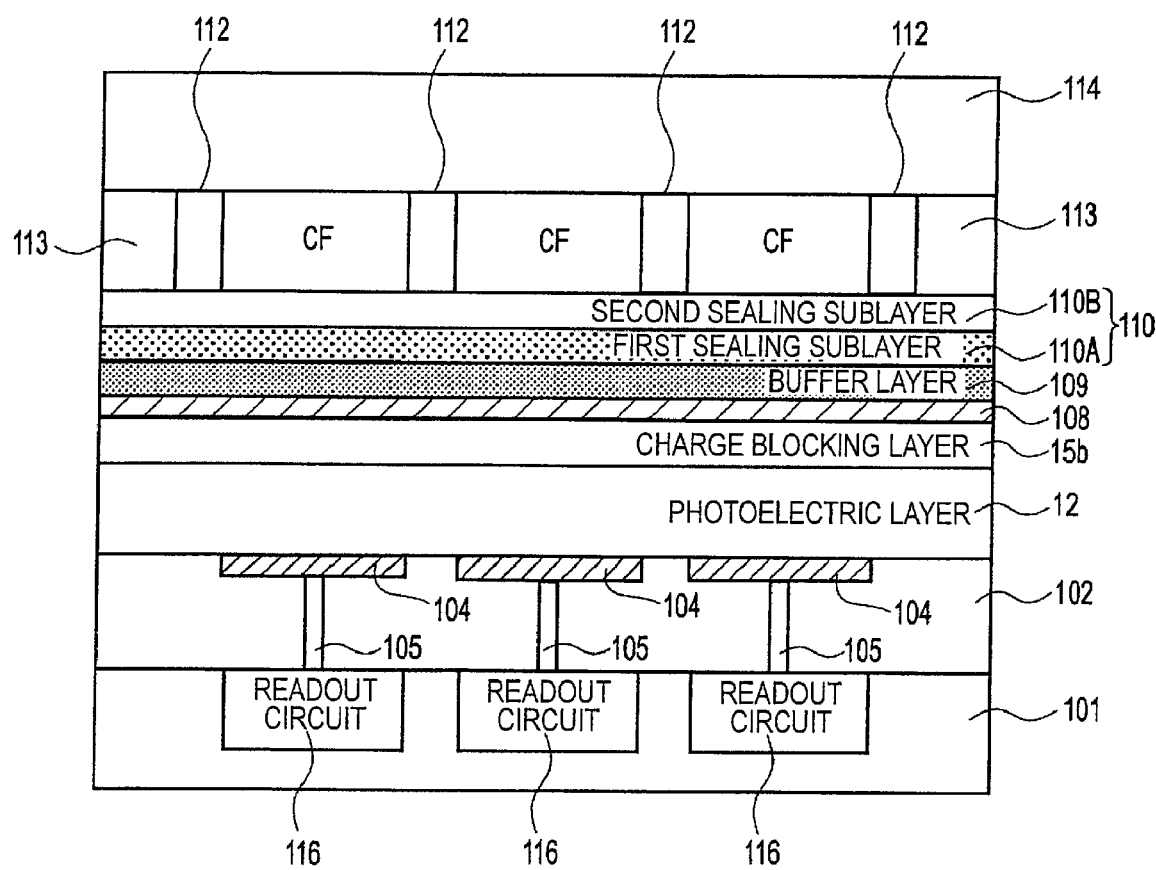
FIG. 54 is a schematic cross-section representing still another example of the structure of the solid state imaging device of the invention.

FIG. 54 is a schematic cross-section representing the structure of still another solid state imaging device. In the solid state imaging device of FIG. 54, the surface of the pixel electrodes 104 and the surface of the dielectric layer 102 are perfectly coplanar with each other. The photoelectric layer 12 is provided to cover the dielectric layer 102 and the pixel electrodes 104. A charge blocking layer 15b is disposed on the photoelectric layer. The charge blocking layer 15b functions to prevent injection of electrons from the counter electrode 108 to the photoelectric layer 12. In the configuration shown, the potential of the counter electrode 108 is set lower than the source potential of the reset transistor in the readout circuit 116 so that an electric current may flow from the pixel electrodes 104 to the counter electrode 108, i.e., electrons may be collected by the pixel electrodes 104.

The readout circuit 116 is composed of an FD, a reset transistor, an output transistor, and a select transistor as illustratively shown in FIG. 43. All these transistors are of pMOS type. As previously described, the readout circuit 116 further had an additional pMOS transistor connected to the FD for limiting the FD potential and a feedback circuit between the reset transistor and the signal line for kTC noise reduction. The pixel electrodes 104 were each composed of an aluminum layer as a low resistance layer, which connected to the FD through the via plug 105, and a TiN layer as a surface layer. The pixel electrodes 104 were formed by the aforementioned trench isolation process. The dielectric layer 102, the pixel electrodes 104, the multilevel interconnects including via plugs 105, and the readout circuits 116 were fabricated using standard CMOS image sensor processes.

The photoelectric layer 12 was formed by co-depositing compound 3 of formula (3) and fullerene $C_{60}$ at a ratio of 20:80 (%) to a thickness of 400 nm. The charge blocking layer 15b was formed by first depositing compound 3 to a thickness of 20 nm by vacuum evaporation and then depositing compound 4 of formula (4) below to a thickness of 300 nm by vacuum evaporation. The electron affinity Ea of $C_{60}$ contained in the photoelectric layer is 4.2 eV, and the ionization potential Ip of compound 3 adjoining the photoelectric layer is 5.4 eV, giving $\Delta 1=1.2$ eV. Since both the photoelectric layer and the adjoining charge blocking layer contained compound 3, generation an intermediate level was prevented, whereby production of dark current was effectively controlled. The electron affinity Ea of compound 4 used in the charge blocking layer 15b and adjoining the counter electrode 108 is 1.9 eV, and the work function of ITO (the material of the counter electrode 108) is 4.5 eV. Accordingly, $\Delta 2=2.6$ eV. Injection of electrons from the counter electrode 108 to the photoelectric layer 12 was thus prevented. These deposition steps were carried out at a degree of vacuum of $1\times 10^{-4}$ Pa or less. The photoelectric layer 12 and the charge blocking layer 15b were deposited in the first region indicated in FIG. 1 by placing a first metal mask on the substrate.

Formula (4):

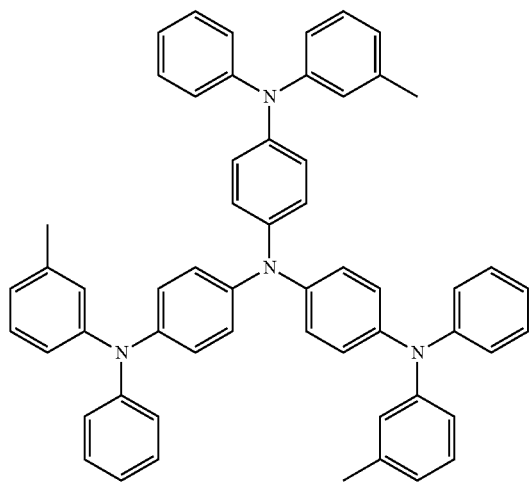

The counter electrode 108, the buffer layer 109, the sealing layer 110, the color filters CF, the peripheral light shielding layer 113, and the protective layer (overcoat layer) 114 were formed in the same manner as described with respect to the configuration of FIG. 53.

Advantages and applications of the solid state imaging device of the invention are described below.

(1) Ease of Modularization

The solid state imaging device of the invention provides a camera module. Modularization requires no special input-output except that a conventional Si photodiode is replaced with a pair of electrodes and an organic layer sandwiched therebetween as a light sensor. Therefore, modularization into a camera module is easily accomplished by using conventional modules.

(2) Chip Size

Since the organic layer 107 and the counter electrode 108 are each capable of being formed over the whole pixel area at a time, micro to large area chips can be fabricated easily by properly combining the fabrication techniques and processes to form the multilevel interconnects including the readout circuits 106 and the via plugs 105 and the pixel electrodes 104. In fabricating micro chips by standard semiconductor fabrication processes, the leading edge technology may be applied unlimitedly to easily achieve pixel size minimization, pixel count maximization, and high-volume manufacturing. In fabricating large area chips, TFT processes for liquid crystal display fabrication may be utilized to allow for low cost, high volume manufacturing.

(3) Pixel Size

There has been a strong demand for increasing the pixel count and reducing the manufacturing cost of image sensors, and the pixel size has been being reduced today. This tendency has rendered it difficult for conventional image sensors using Si photodiodes to efficiently lead incident light to the photodiodes, a light sensing portion. The problem is particularly conspicuous with a pixel size smaller than 2 μm. This problem is avoided with the solid state imaging device of the invention because the organic layer 107 is provided above the readout circuits and allowed to have a high aperture ratio. Therefore, even if the micropatterning technology is further advanced to realize a pixel size less than 2 μm, particularly about 1 μm, the imaging device of the invention will encounter no technical problem in the practice.

(4) Cost Competitiveness

The structure of the solid state imaging device of the invention allows omitting a microlens array and an IR cut-off filter that have been required in conventional image sensors, which leads to cost reduction. That is, the solid state imaging device achieves a pixel aperture ratio of higher than 80% so that using a microlens array is not essential. The photoelectric layer may be made of an organic colorant insensitive to IR light. This excludes the necessity of using an IR cut-off filter.

(5) Superiority in Performance

By virtue of the structure, the solid state imaging device of the invention provides superior image quality compared with conventional image sensors. Firstly, the pixel aperture ratio more than 80% secures an increased amount of incident light and ease of obtaining high sensitivity. This enables a clear image of a dark scene. Because of the high aperture ratio, the readout circuits provide an increased output voltage amplitude, allowing the saturation charge to be increased. This enables a clear image of a bright scene. Secondly, it is possible to obtain both high sensitivity and a great saturation charge, thereby to provide a wide dynamic range. This enables taking a clear image of a high contrast scene with no over-exposure nor under-exposure.

The above described features of the solid state imaging device of the invention are taken advantage of to enhance the performance of digital still cameras and digital video cameras. The imaging device is also suited for use in an endoscope that needs to have high imaging performance and a small size. The imaging device is markedly advantageous over conventional image sensors in application to mobile phone cameras that strictly demand all of high performance, small size, and low cost. Applications of the structure of the invention is not limited to the above and include monitoring cameras, drive recorders, robot cameras, and so on.

The above descriptions supports the following embodiments.

(1) A solid state imaging device comprising an array of pixels, each pixel comprising:
  a pixel electrode,
  an organic layer above the pixel electrode and having a photoelectric layer generating charges in response to light received,
  a counter electrode above the organic layer and common to the pixels,
  a sealing layer covering the counter electrode,
  a color filter above the sealing layer, and a readout circuit reading a signal corresponding to the charge collected by the pixel electrode, the photoelectric layer containing an organic p type semiconductor and an organic n type semiconductor, the organic layer further having a charge blocking layer being between the photoelectric layer and at least one of the pixel electrode and the counter electrode and blocking charge injection from the pixel electrode and/or the counter electrode to the photoelectric layer, the ionization potential of the charge blocking layer and the electron affinity of the organic n type semiconductor in the photoelectric layer having a difference of at least 1 eV, and the solid-state imaging device further comprising a transparent partition wall between adjacent color filters of adjacent pixels of the array of pixels, the partition wall being made of a transparent material having a lower refractive index than the material of the color filters.

(2) The solid-state imaging device according to (1), wherein the material of the partition wall comprises a fluororesin.

(3) A method of fabricating the solid-state imaging device according to (1) or (2), comprising the successive steps of:
forming red color filters and blue color filters in a Bayer array,
forming the partition walls,
forming green color filters, and
planarizing the red color filters, the blue color filters, the green color filters, and the partition walls by chemical mechanical polishing or etch-back.

(4) The method of fabricating the solid-state imaging device according to (3), wherein the color filters are formed by dry etching.

What is claimed is:

1. A solid state imaging device comprising an array of pixels, each of the pixels comprising:
   a pixel electrode;
   an organic layer which is provided above the pixel electrode and comprises a photoelectric layer generating charges in response to light received;
   a counter electrode which is provided above the organic layer and is common to the pixels;
   a sealing layer covering the counter electrode;
   a color filter provided above the sealing layer; and
   a readout circuit reading a signal corresponding to the charge collected by the pixel electrode,
   the photoelectric layer containing an organic p type semiconductor and an organic n type semiconductor,
   the organic layer further comprising a charge blocking layer between the photoelectric layer and at least one of the pixel electrode and the counter electrode to block charge injection from the at least one of the pixel electrode and the counter electrode to the photoelectric layer,
   an ionization potential of the charge blocking layer and an electron affinity of the organic n type semiconductor in the photoelectric layer having a difference of at least 1 eV, and
   the solid-state imaging device further comprising a transparent partition wall between adjacent color filters of adjacent pixels of the array of pixels, the partition wall being made from a transparent material having a lower refractive index than a material forming the color filters.

2. The solid-state imaging device according to claim 1, wherein the material forming the partition wall comprises a fluororesin.

3. The solid-state imaging device according to claim 1, wherein the partition wall is made from the transparent material which has a refractive index of smaller than 1.5.

4. The solid-state imaging device according to claim 2, wherein the partition wall is made from the transparent material which has a refractive index of smaller than 1.5.

5. The solid-state imaging device according to claim 1, wherein the partition wall is made from the transparent material which has a refractive index of smaller than 1.4.

6. The solid-state imaging device according to claim 2, wherein the partition wall is made from the transparent material which has a refractive index of smaller than 1.4.

7. The solid-state imaging device according to claim 1, wherein the color filter is made from a photo-insensitive curing composition free of a photo curing component.

8. The solid-state imaging device according to claim 2, wherein the color filter is made from a photo-insensitive curing composition free of a photo curing component.

9. The solid-state imaging device according to claim 3, wherein the color filter is made from a photo-insensitive curing composition free of a photo curing component.

10. The solid-state imaging device according to claim 1, wherein the color filter is made from a thermosetting composition.

11. The solid-state imaging device according to claim 2, wherein the color filter is made from a thermosetting composition.

12. The solid-state imaging device according to claim 3, wherein the color filter is made from a thermosetting composition.

13. A method for fabricating the solid-state imaging device according to claim 1, comprising, in the following order:
    forming red color filters and blue color filters in a Bayer array,
    forming the partition walls,
    forming green color filters, and
    planarizing the red color filters, the blue color filters, the green color filters, and the partition walls by chemical mechanical polishing or etch-back.

14. The method for fabricating the solid-state imaging device according to claim 13, wherein the color filters are formed by dry etching.

* * * * *